(12) United States Patent
Kim et al.

(10) Patent No.: US 8,179,711 B2
(45) Date of Patent: *May 15, 2012

(54) SEMICONDUCTOR MEMORY DEVICE WITH STACKED MEMORY CELL AND METHOD OF MANUFACTURING THE STACKED MEMORY CELL

(75) Inventors: Sung-min Kim, Incheon Metropolitan (KR); Eun-jung Yun, Seoul (KR); Jong-soo Seo, Hwaseong-si (KR); Du-eung Kim, Yongin-si (KR); Beak-hyung Cho, Hwaseong-si (KR); Byung-seo Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 727 days.

This patent is subject to a terminal disclaimer.

(21) Appl. No.: 12/273,225

(22) Filed: Nov. 18, 2008

(65) Prior Publication Data

US 2009/0168493 A1 Jul. 2, 2009

Related U.S. Application Data

(63) Continuation-in-part of application No. 11/238,381, filed on Sep. 29, 2005, now Pat. No. 7,453,716.

(30) Foreign Application Priority Data

Oct. 26, 2004 (KR) .................. 10-2004-0085804
Apr. 26, 2005 (KR) .................. 10-2005-0034552

(51) Int. Cl.
*G11C 11/00* (2006.01)

(52) U.S. Cl. ........................ 365/148; 365/163
(58) Field of Classification Search ................. 365/100, 365/148, 157, 158, 163

See application file for complete search history.

(56) References Cited

U.S. PATENT DOCUMENTS 4,119,924 A 10/1978 Ahmed
(Continued)

FOREIGN PATENT DOCUMENTS

JP 10-2004-0185723 7/2004
(Continued)

OTHER PUBLICATIONS

"Semiconductor Memory Device with Stacked Control Transistors" Specification, Drawings, and Prosecution History, of U.S. Appl. No. 11/238,381, filed Sep. 29, 2005, by Sung-min Kim, et al., which is stored in the United States Patent and Trademark Office (USPTO) Image File Wrapper (IFW) system.

(Continued)

*Primary Examiner* — Anh Phung
*Assistant Examiner* — Khamdan Alrobaie
(74) *Attorney, Agent, or Firm* — Onello & Mello, LLP

(57) ABSTRACT

In a semiconductor memory device and method, resistive-change memory cells are provided, each including a plurality of control transistors formed on different layers and variable resistance devices comprising a resistive-change memory. Each resistive-change memory cell includes a plurality of control transistors formed on different layers, and a variable resistance device formed of a resistive-change memory. In one example, the number of the control transistors is two. The semiconductor memory device includes a global bit line; a plurality of local bit lines connected to or disconnected from the global bit line via local bit line selection circuits which correspond to the local bit lines, respectively; and a plurality of resistive-change memory cell groups storing data while being connected to the local bit lines, respectively. Each of the resistive-change memory cells of each of the resistive-change memory cell groups comprises a plurality of control transistors formed on different layers, and a variable resistance device formed of a resistive-change memory. In addition, the semiconductor memory device has a hierarchical bit line structure that uses a global bit line and local bit lines. Accordingly, it is possible to increase both the integration density of the semiconductor memory device and the amount of current flowing through each of the resistive-change memory cells.

32 Claims, 17 Drawing Sheets

U.S. PATENT DOCUMENTS

| | | | |
|---|---|---|---|
| 5,010,520 A | 4/1991 | Minagawa et al. | |
| 5,686,335 A | 11/1997 | Wuu et al. | |
| 5,883,827 A | 3/1999 | Morgan | |
| 6,034,882 A | 3/2000 | Johnson et al. | |
| 6,351,406 B1 | 2/2002 | Johnson et al. | |
| 6,480,438 B1 | 11/2002 | Park | |
| 6,487,113 B1 | 11/2002 | Park et al. | |
| 6,522,580 B2 | 2/2003 | Chen et al. | |
| 6,545,906 B1 | 4/2003 | Savtchenko et al. | |
| 6,775,176 B2 | 8/2004 | Kihara | |
| 6,781,871 B2 | 8/2004 | Park et al. | |
| 6,849,891 B1 | 2/2005 | Hsu et al. | |
| 6,862,214 B2 | 3/2005 | Lee et al. | |
| 6,937,505 B2 | 8/2005 | Morikawa | |
| 7,002,837 B2 | 2/2006 | Morimoto | |
| 7,061,790 B2 | 6/2006 | Morimoto et al. | |
| 7,145,796 B2 * | 12/2006 | Fukuzumi et al. | 365/158 |
| 7,282,759 B2 | 10/2007 | Kim et al. | |
| 7,286,394 B2 | 10/2007 | Ooishi | |
| 7,309,885 B2 | 12/2007 | Park et al. | |
| 7,345,899 B2 | 3/2008 | Nirschl et al. | |
| 7,453,716 B2 | 11/2008 | Kim et al. | |
| 2002/0172073 A1 * | 11/2002 | Hidaka | 365/158 |
| 2003/0026125 A1 * | 2/2003 | Hidaka | 365/158 |
| 2004/0029310 A1 | 2/2004 | Bernds et al. | |
| 2004/0174732 A1 * | 9/2004 | Morimoto | 365/148 |
| 2005/0030787 A1 | 2/2005 | Lowrey et al. | |
| 2005/0030800 A1 | 2/2005 | Johnson et al. | |
| 2006/0077737 A1 * | 4/2006 | Ooishi | 365/203 |
| 2006/0120148 A1 | 6/2006 | Kim et al. | |
| 2007/0034908 A1 | 2/2007 | Cho et al. | |
| 2007/0268742 A1 | 11/2007 | Liu | |
| 2010/0008163 A1 * | 1/2010 | Liu | 365/189.011 |

FOREIGN PATENT DOCUMENTS

| | | |
|---|---|---|
| JP | 2004-185723 | 7/2004 |
| KR | 10-2003-0078620 | 10/2003 |
| KR | 2003-0078620 | 10/2003 |
| KR | 10-2004-0049288 | 6/2004 |

OTHER PUBLICATIONS

Taiwanese Office Action dated Jul. 30, 2009, issued in corresponding International Application No. 095114912 with English language translation.

CMOS Devices and Techonology for VLSI. Englewood Cliffs, New Jersey: Prentice Hall, Inc., 1990, pp. 114 and 148.

Prosecution History of Parent U.S. Appl. No. 11/238,381, filed Sep. 29, 2005 available at www.uspto.gov.

* cited by examiner

SEMICONDUCTOR MEMORY DEVICE WITH STACKED MEMORY CELL AND METHOD OF MANUFACTURING THE STACKED MEMORY CELL

RELATED APPLICATIONS

This application is a continuation-in-part application of U.S. Ser. No. 11/238,381, filed Sep. 29, 2005, which claims the priority of Korean Patent Application Nos. 10-2004-0085804, filed on Oct. 26, 2004 and 10-2005-0034552, filed on Apr. 26, 2005 in the Korean Intellectual Property Office. The disclosures of all the above applications are incorporated herein by reference in their entirety.

BACKGROUND OF THE INVENTION

1. Field of the Invention

The present invention relates to a semiconductor memory device, and more particularly, to a semiconductor memory device with a stacked memory cell.

2. Description of the Related Art

A Phase-change random Access Memory (PRAM) is formed of a phase-change material such as a chalcogenide alloy that changes into a first of two phases when it is heated and cooled, and changes into a second phase when it is heated and cooled again. Here, the two phases are crystalline and amorphous phases. The PRAM is disclosed in U.S. Pat. Nos. 6,487,113 and 6,480,438. The PRAM has a low resistance value when it becomes crystalline, and a high resistance value when it is amorphous. A logic value can be determined as 0 or 1 according to the resistance value of the PRAM. The crystalline phase of the PRAM corresponds to a set state or has a logic value of 0, and the amorphous phase thereof corresponds to a reset state or has a logic value of 1.

To change the phase of the PRAM into the amorphous phase, the PRAM is heated to a temperature greater than a melting temperature of the PRAM and rapidly cooled down. To change the phase of the PRAM into the crystalline phase, the PRAM is heated to a temperature lower than the melting temperature for a predetermined time.

A key point to the PRAM is that it is formed of a phase-change material such as chalcogenide. In general, the phase-change material is a GST alloy composed of germanium (Ge), antimony (Sb), and tellurium (Te). When the GST alloy is heated or cooled, its state rapidly changes between the amorphous state (reset state) and the crystalline state (set state), that is, its logic value is switched between 1 and 0. Therefore, the GST alloy is useful as a material for a PRAM memory device.

To write data to a memory cell of the PRAM, the chalcogenide is heated to a temperature equal to or greater than its melting temperature and rapidly cooled down to place the chalcogenide in an amorphous state. Otherwise, chalcogenide is heated at a temperature less than the melting temperature, maintained at the temperature, and cooled to change the chalcogenide into a crystalline state.

FIG. 1 is a circuit diagram of a conventional phase-change memory cell 10 disclosed in U.S. Pat. No. 5,883,827. The memory cell 10 includes a phase-change variable resistance device R1, a first terminal of which is connected to a bit line BL and a second terminal of which is connected to a drain of a selection transistor N1, and the selection transistor N1 whose gate is connected to a word line WL and whose source is connected to a reference voltage VSS.

FIG. 2 is a circuit diagram of a phase-change memory array 100 comprising a plurality of phase-change memory cells 10 equivalent to the phase-change memory 10 of FIG. 1. The plurality of phase-change memory cells 10 are connected to a bit line BL which is connected to a sense amplifier (not shown).

The PRAM has lately attracted considerable attention as a next-generation memory. However, integrity of the PRAM needs to be improved in order for the PRAM to be competitive with other types of memory, such as Dynamic Random Access Memory (DRAM), Static Random Access Memory (SRAM), and flash memory.

As described above, data is written to the PRAM by heating the PRAM using Joule heat. However, there is a restriction to reducing a size of a control transistor of a conventional memory cell, which supplies current required to generate the Joule heat, thereby preventing an increase in the integration density of the PRAM.

Accordingly, there is a growing requirement for a cell structure that can increase the integration density of the PRAM and an improvement of the configuration of a semiconductor memory device using the improved cell structure.

SUMMARY OF THE INVENTION

The present invention provides a phase-change memory cell with improved integration density.

The present invention also provides a semiconductor memory device with such a random change access memory (PRAM) cell.

According to an aspect of the present invention, there is provided a phase-change memory cell comprising a plurality of control transistors formed on different layers, and a variable resistance device formed of a phase-change material.

In one embodiment, the number of control transistors is two.

In another embodiment, the control transistors include a first control transistor which is a bulk transistor, and a second control transistor which is formed on the first control transistor and is a thin layer transistor.

In another embodiment, the control transistors further include a third control transistor formed on the second control transistor. The control transistors may be MOS transistors, and form a diode. The control transistors may optionally comprise bipolar transistors. The second control transistor may be formed on the first control transistor. The variable resistance device may comprise germanium (Ge), antimony (Sb), and tellurium (Te).

According to another aspect of the present invention, there is provided a semiconductor memory device comprising a global bit line; a plurality of local bit lines connected to or disconnected from the global bit line through local bit line selection circuits which correspond to the local bit lines, respectively; and a plurality of phase-change memory cell groups storing data when connected to the local bit lines, respectively. Each of the phase-change memory cells of each of the phase-change memory cell groups comprises a plurality of control transistors formed on different layers, and a variable resistance device formed of a phase-change material.

In one embodiment, the local bit line selection circuits are transistors which connect the local bit lines to the global bit line or disconnect the local bit lines from the global bit line, in response to a local bit line selection signal. Gates of all the control transistors are connected to a corresponding word line.

In another embodiment, the semiconductor memory device optionally further includes a peripheral circuit. The peripheral circuit may comprise an inverter circuit which includes a bulk transistor formed on a first layer and a thin layer transistor formed on a second layer. The bulk transistor may comprise an NMOS transistor and the thin layer transistor may comprise a PMOS transistor.

In another embodiment, the semiconductor memory device further includes a sense amplifier connected to the global bit line.

According to yet another aspect of the present invention, there is provided a phase-change memory cell including a plurality of control transistors gates of which are connected to a word line and which are formed on different layers, and a variable resistance device. One of a first terminal and a second terminal of each control transistor is connected to the variable resistance device and the other is connected to a ground voltage source.

According to still another aspect of the present invention, there is provided a phase-change memory cell including a first control transistor formed on a first substrate and having a source, gate, and drain, a second substrate formed on the first control transistor; a second control transistor formed on the second substrate and having a source, gate, and drain; and a variable resistance device connected to one of the source and the drain of the second control transistor and formed of a phase-change material.

In one embodiment, the source of the first control transistor is electrically connected to the source of the second control transistor, the drain of the first control transistor is electrically connected to the drain of the second control transistor, and the gate of the first control transistor is electrically connected to the gate of the second control transistor.

In another embodiment, the first and second control transistors have a planar transistor structure, a fin field effect transistor structure, or a multi-channel field effect transistor structure.

In another embodiment, the second substrate is formed to be parallel with the first substrate and partially overlap the first substrate. A first contact plug which connects the variable resistance device to one of the source and the drain of the first control transistor, and a second contact plug which connects an external power source to one of the source and the drain of the first control transistor are formed of a conductive layer.

In another embodiment, the contact plugs are connected to the source and drain of the second control transistor.

According to still another aspect of the present invention, there is provided a method of fabricating a phase-change memory cell, the method including forming a first control transistor having a source, gate, and drain on a first substrate; forming a second substrate on the first control transistor; forming a second control transistor having a source, gate, and drain on the second substrate; and connecting a variable resistance device to one of the source and the drain of the second control transistor, the variable resistance device formed of a phase-change material.

In one embodiment, the method further includes forming a first contact plug which connects the variable resistance device to one of the source and the drain of the first control transistor, and a second contact plug which connects an external power source to one of the source and the drain of the first control transistor.

Embodiments of the present invention also provide a resistive-change memory cell with improved integration density.

According to one aspect, there is provided a resistive-change memory cell comprising a plurality of control transistors formed on different layers, and a variable resistance device formed of a resistive-change memory, the variable resistance device coupled to each of the control transistors, wherein the plurality of control transistors are connected to each other in parallel.

In one embodiment the number of the control transistors is two.

In another embodiment the control transistors include a first control transistor which is a bulk transistor, and a second control transistor formed on the first control transistor and being a thin layer transistor.

In another embodiment the control transistors include a third control transistor formed on the second control transistor. The control transistors may be MOS transistors or bipolar transistors. The control transistors may form a diode. The variable resistance device may comprise germanium (Ge), antimony (Sb), and tellurium (Te).

According to another aspect, there is provided a semiconductor memory device comprising a global bit line, a plurality of local bit lines connected to or disconnected from the global bit line via local bit line selection circuits which correspond to the local bit lines, respectively, and a plurality of resistive-change memory cell groups storing data when connected to the local bit lines, respectively. Each of the resistive-change memory cells of each of the resistive-change memory cell groups comprises a plurality of control transistors formed on different layers, and a variable resistance device formed of a resistive-change memory, the variable resistance device coupled to each of the control transistors, wherein the plurality of control transistors are connected to each other in parallel.

In one embodiment, the local bit line selection circuits are transistors which connect the local bit lines to the global bit line or disconnect the local bit lines from the global bit line in response to a local bit line selection signal. Gates of the control transistors may be connected to a corresponding word line.

In another embodiment, the number of the plurality of control transistors is two.

In another embodiment, each of the plurality of control transistors comprises a first control transistor which is a bulk transistor, and a second control transistor formed on the first control transistor and being a thin layer transistor. The plurality of control transistors may further comprise a third control transistor formed on the second control transistor. The control transistors may be one of a MOS transistor and a bipolar transistor. The plurality of the control transistors may form a diode. The variable resistance device may comprise germanium (Ge), antimony (Sb), and tellurium (Te).

In another embodiment, the semiconductor memory device optionally further includes a peripheral circuit. The peripheral circuit may comprise an inverter circuit which includes a bulk transistor and a thin layer transistor formed on the bulk transistor. The bulk transistor may be an NMOS transistor and the thin layer transistor may be a PMOS transistor.

In another embodiment, the semiconductor memory device may further comprising a sense amplifier connected to the global bit line.

According to still another aspect, there is provided a resistive-change memory cell comprising a plurality of control transistors, gates of each of which are connected to a same word line, and the control transistors formed at different layers, and a variable resistance device formed of a resistive-change memory, wherein one of a first terminal and a second terminal of each of the control transistors is connected to the variable resistance device and the other is connected to a ground voltage, wherein the plurality of control transistors are connected to each other in parallel.

In one embodiment, the control transistors comprise a first control transistor which is a bulk transistor, and a second control transistor formed on the first control transistor and being a thin layer transistor. The control transistors may further comprise a third control transistor formed on the second control transistor. Each of the control transistors may be one of a MOS transistor and a bipolar transistor. The control transistors may form a diode.

According to still another aspect, there is provided a resistive-change memory cell comprising a first control transistor formed on a first substrate and having a source, gate, and drain, a second substrate formed on the first control transistor, a second control transistor formed on the second substrate and having a source, gate, and drain, and a variable resistance device connected to one of the source and the drain of the second control transistor and formed of a resistive-change memory, wherein the source of the first control transistor is electrically connected to the source of the second control transistor, the drain of the first control transistor is electrically connected to the drain of the second control transistor, and the gate of the first control transistor is electrically connected to the gate of the second control transistor.

In one embodiment, the first and second control transistors have a planar transistor structure.

In another embodiment the first and second control transistors have a fin field effect transistor structure.

In another embodiment the first and second control transistors have a multi-channel field effect transistor structure.

In another embodiment the first control transistor is a bulk transistor and the second control transistor is a thin layer transistor.

In another embodiment, the second substrate is formed to be parallel with the first substrate and partially overlap the first substrate, and a first contact plug which connects the variable resistance device to one of the source and the drain of the first control transistor, and a second contact plug which connects an external power source to one of the source and the drain of the first control transistor are formed of a conductive layer. The contact plugs may be connected to the source and drain of the second control transistor. The first and second control transistors may have different structures which are selected from the structures of a planar transistor, a fin field effect transistor, and a multi-channel field effect transistor.

According to still another aspect, there is provided a method of fabricating a resistive-change memory cell, comprising forming a first control transistor having a source, gate, and drain on a first substrate, forming a second substrate on the first control transistor, forming a second control transistor having a source, gate, and drain on the second substrate, connecting a variable resistance device to one of the source and the drain of the second control transistor, the variable resistance device formed of a resistive-change memory, wherein the source of the first control transistor is electrically connected to the source of the second control transistor, the drain of the first control transistor is electrically connected to the drain of the second control transistor, and the gate of the first control transistor is electrically connected to the gate of the second control transistor.

In one embodiment, the first and second control transistors have a planar transistor structure.

In another embodiment, the first and second control transistors have a fin field effect transistor structure.

In another embodiment, the first and second control transistors have a multi-channel field effect transistor structure.

In another embodiment, the first control transistor is a bulk transistor, and the second control transistor is a thin layer transistor.

In another embodiment, the second substrate is formed to be parallel with the first substrate and partially overlap with the first substrate.

In another embodiment the method further includes forming a first contact plug which connects the variable resistance device to one of the source and the drain of the first control transistor, and a second contact plug which connects an external power source to one of the source and the drain of the first control transistor, wherein the contact plugs are formed of a conductive layer. The contact plugs may be connected to the source and drain of the second control transistor.

In another embodiment, the first and second control transistors have different structures which are selected from the structures of a planar transistor, a fin field effect transistor, and a multi-channel field effect transistor.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

Figure 1:
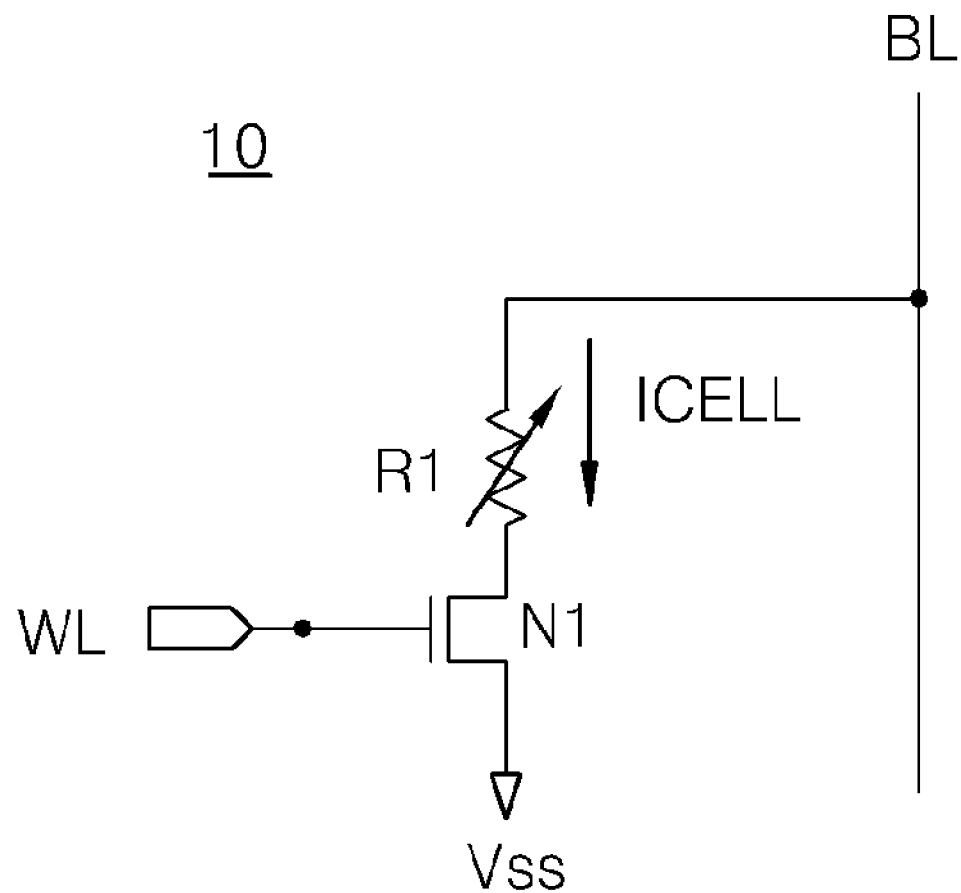
FIG. 1 is a circuit diagram of a conventional phase-change memory cell.
Figure 2:
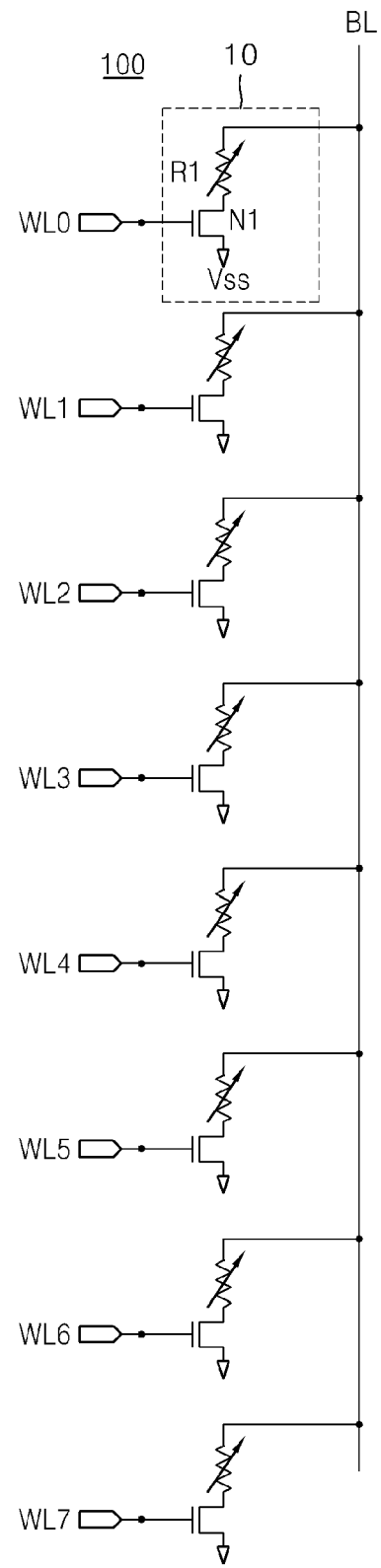
FIG. 2 is a circuit diagram of a phase-change memory array with a plurality of phase-change memory cells equivalent to the phase-change memory cell of FIG. 1.

Hereinafter, exemplary embodiments of the present invention will be described in detail with reference to the accompanying drawings. Like reference numerals are used to designate like or equivalent elements throughout this disclosure.

A cell structure of a semiconductor memory device according to an embodiment of the present invention will now be described with reference to FIGS. 3 and 4. In this embodiment, the semiconductor memory device indicates a phase-change random access memory (PRAM) formed of a phase-change material.

Figure 3A:
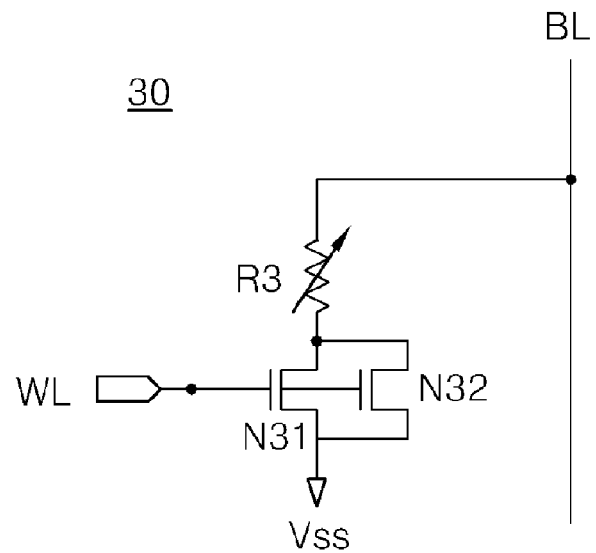
FIG. 3A is a circuit diagram of a phase-change memory cell according to an embodiment of the present invention.

Referring to FIG. 3A, a phase-change memory cell 30 includes first and second control transistors N31 and N32 on different layers, and a variable resistance device R3 formed of a phase-change material.

Gates of the first and second control transistors N31 and N32 are connected to a word line WL. A first terminal of each of the first and second control transistors N31 and N32 is connected to a reference voltage, e.g., a ground voltage Vss.

A second terminal of each of the respective first and second control transistors N31 and N32 is connected to a first terminal of the variable resistance device R3. A second terminal of the variable resistance device R3 is connected to a bit line BL.

Figure 4A:
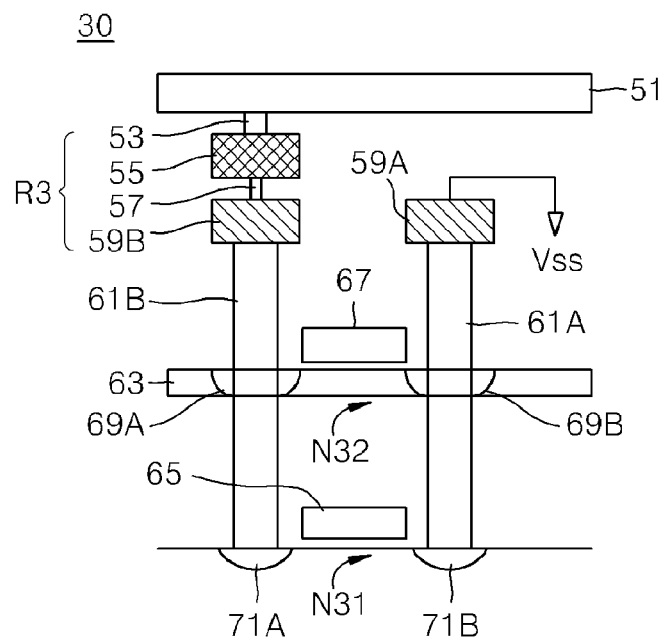
FIG. 4A is a diagram illustrating the vertical structure of the phase-change memory cell of FIG. 3A.

Referring to FIG. 4A, the first and second control transistors N31 and N32 are formed on different layers. In one embodiment, the first control transistor N31 is a bulk transistor and the second control transistor N32 is a thin layer transistor formed in layer 63. Both a gate electrode 65 of the first control transistor N31 and a gate electrode 67 of the second control transistor N32 are connected to a word line (not shown).

Both a source electrode 71B of the first control transistor N31 and a source electrode 69B of the second control transistor N32 are connected to the ground voltage Vss and a first landing pad 59A via a first contact plug 61A. Both a drain electrode 71A of the first control transistor N31 and a drain electrode 69A of the second control transistor N32 are connected to a second landing pad 59B via a second contact plug 61B.

The landing pad 59B is connected to a phase change layer 55 via a lower electrode 57. The phase change layer 55 is connected to a local bit line 51 via an electrode 53. The second control transistor N32 is a thin layer transistor formed on a silicon epitaxial layer (not shown).

In different embodiments for different applications, the first and second control transistors N31 and N32 may be MOS transistors or bipolar transistors, and may form a diode.

According to this embodiment, the control transistors N31 and N32 are formed on different layers to increase the integration density of the semiconductor memory device. The phase-change memory cell 30 includes the control transistors N31 and N32 to increase the amount of current flowing through the variable resistance device R3, which in turn provides the necessary heat for rapidly changing the phase of the device. However, the inclusion of multiple control transistors N31 and N32 would increase the size of the phase-change memory cell 30. To solve this problem, the multiple control transistors N31 and N32 are formed on different layers of the device.

Figure 3B:
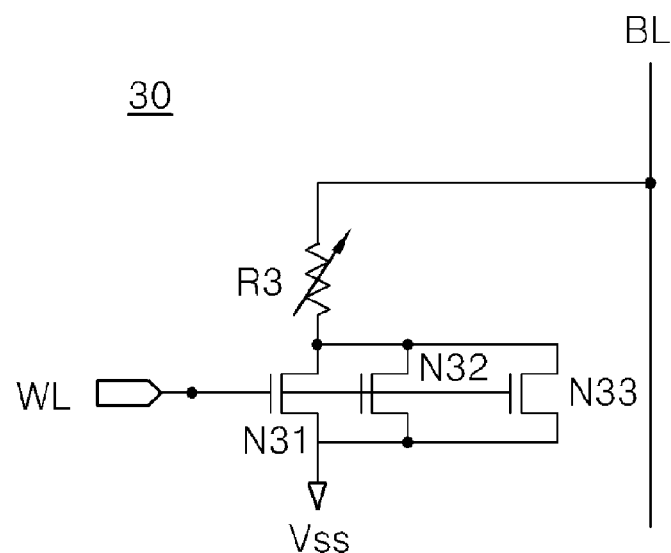
FIG. 3B is a circuit diagram of a phase-change memory cell comprising a third control transistor according to an embodiment of the present invention.
Figure 4B:
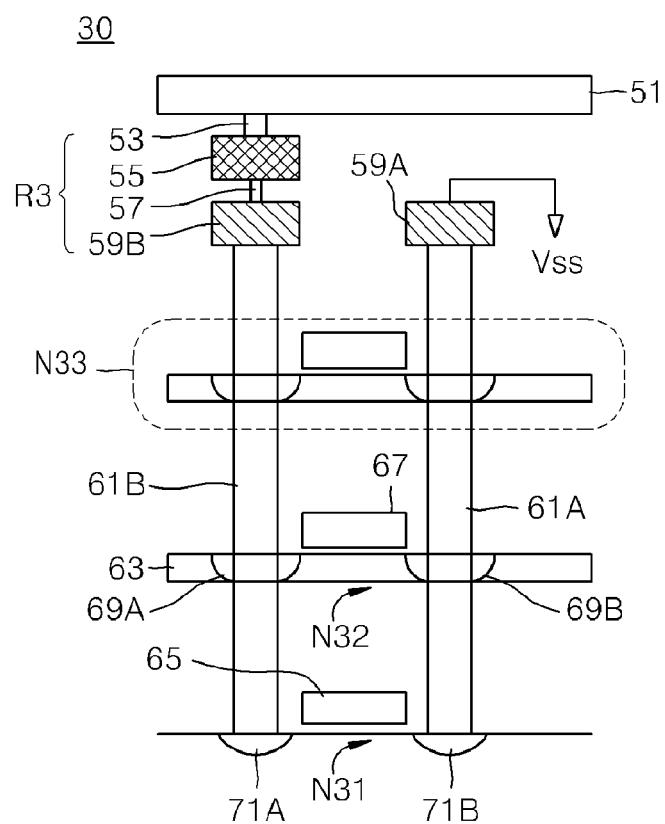
FIG. 4B is a diagram illustrating the vertical structure of the phase-change memory cell of FIG. 3B.

As shown in FIGS. 3B and 4B, a third control transistor N33 that is a thin layer transistor may be added to the phase-change memory cell 30 to further increase the integration of the phase-change memory cell 30.

Figure 5:
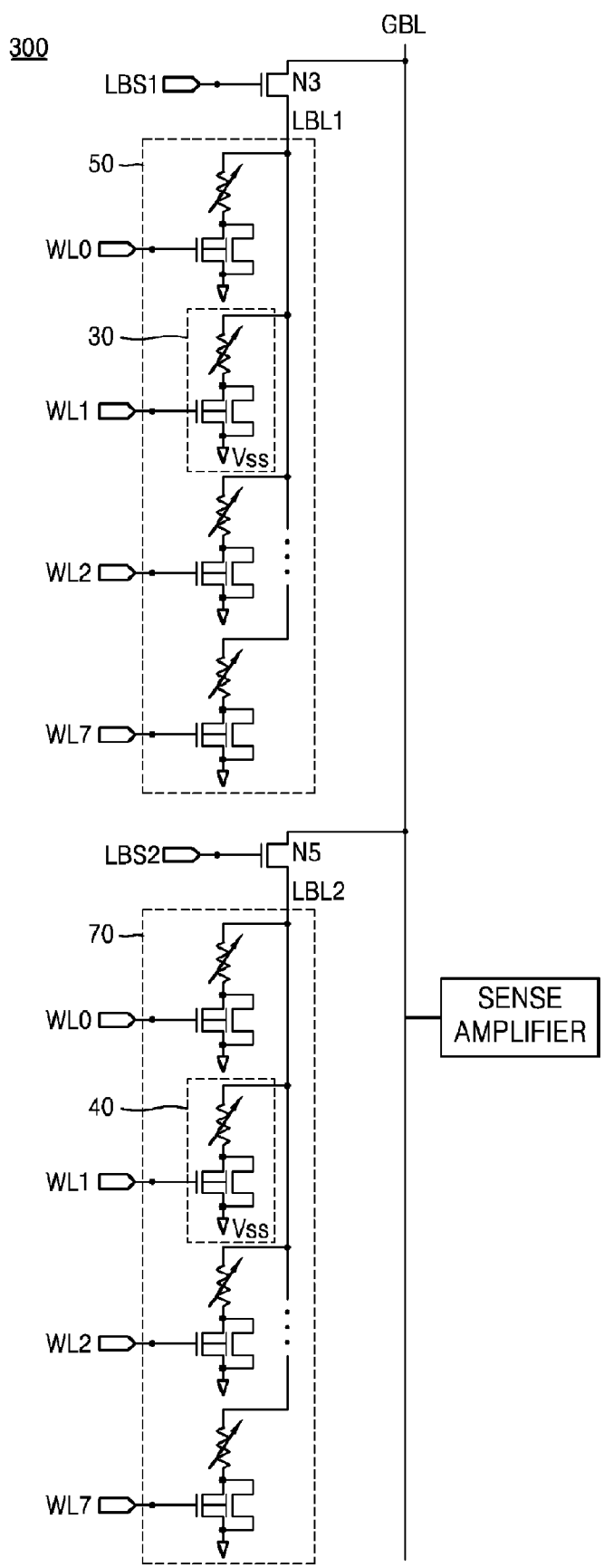
FIG. 5 is a circuit diagram of a phase-change memory array of a semiconductor memory device according to an embodiment of the present invention, the phase-change memory array including a plurality of phase-change memory cells equivalent to the phase-change memory cell of FIG. 3.

FIG. 5 is a circuit diagram of a phase-change memory array 300 of a semiconductor memory device (not shown) according to an embodiment of the present invention. The phase-change memory array 300 includes a global bit line GBL; first and second local bit lines LBL1 and LBL2; and first and second phase-change memory cell groups 50 and 70, such as the phase-change memory cell 30 of FIG. 3, that store data while being connected to the local bit lines LBL1 and LBL2, respectively.

The local bit lines LBL1 and LBL2 are connected to, or disconnected from, the global bit line GBL through first and second local bit line selection circuits N3 and N5, respectively. That is, the local bit line selection circuits N3 and N5 may be transistors that allow the local bit lines LBL1 and LBL2 to be connected to or disconnected from the global bit line GBL in response to local bit line selection signals LBS1 and LBS2. In FIG. 5, only two local bit lines LBL1 and LBL2 are illustrated, but the number of local bit lines is not limited.

Each of a plurality of phase-change memory cells 30 of the first phase-change memory cell group 50, and each of a plurality of phase-change memory cells 40 of the second phase-change memory cell group 70 include a plurality of the control transistors formed on different layers and a variable resistance device formed of a phase-change material. In FIG. 5, the number of phase-change memory cells of each of the phage change memory cell groups 50 and 70 is seven, however, the number of phase-change memory cells is not limited thereto.

Referring to FIG. 5, the phase-change memory cells 30 of the first phase-change memory cell group 50 are connected to the first local bit line LBL1, and the phase-change memory cells 40 of the second phase-change memory cell group 70 are connected to the second local bit line LBL2.

The first local bit line selection circuit N3 connects the first local bit line LBL1 to the global bit line GBL in response to the first local bit line selection signal LBS1. The second local bit line selection circuit N5 connects the second local bit line LBL2 to the global bit line GBL in response to the second local bit line selection signal LBS2.

During a read or write operation, the first and second local bit line selection signals LBS1 and LBS2 allow one of the respective first and second phase-change memory cell groups 50 and 70, for which data is to be read from or written to, to be selected in response to an address signal.

A sense amplifier (not shown) is connected to the global bit line GBL to amplify data read from the selected first or second phase-change memory cell group 50 or 70.

As described above, in a semiconductor memory device according to an embodiment of the present invention, each memory cell is fabricated by forming a plurality of the control transistors on different layers. Accordingly, it is possible to supply a large amount of programming current to a phase-change variable-resistance device while reducing the size of each of the memory cells.

Also, it is possible to realize a hierarchical bit line structure of a phase-change memory cell array of a semiconductor memory device according to the present invention, using a global bit line and local bit lines, thereby enabling manufacture of a compact memory array.

A semiconductor memory device according to the present invention may further include a peripheral circuit (not shown). The peripheral circuit may be an inverter circuit that includes a bulk transistor and a thin layer transistor formed on the bulk transistor. The bulk transistor may be an NMOS transistor and the thin layer transistor may be a PMOS transistor.

When the inverter circuit that includes the NMOS transistor and the PMOS transistor formed on different layers is used as the peripheral circuit, the integration density of the semiconductor memory device is further increased. For instance, it is possible to increase the integration of the semiconductor memory device by adding transistors as peripheral circuits to the structure of the phase-change memory cell 30 of FIGS. 3A and 3B.

According to the present invention, the control transistors constituting a phase-change memory cell are formed on different layers, and the number of the control transistors may be more than one. The control transistor has been described with reference to FIG. 3, and thus, a detailed description will be omitted.

In one application, the semiconductor memory device according to the present invention is installed on a system LSI logic chip, together with a logic chip.

Figure 6A:
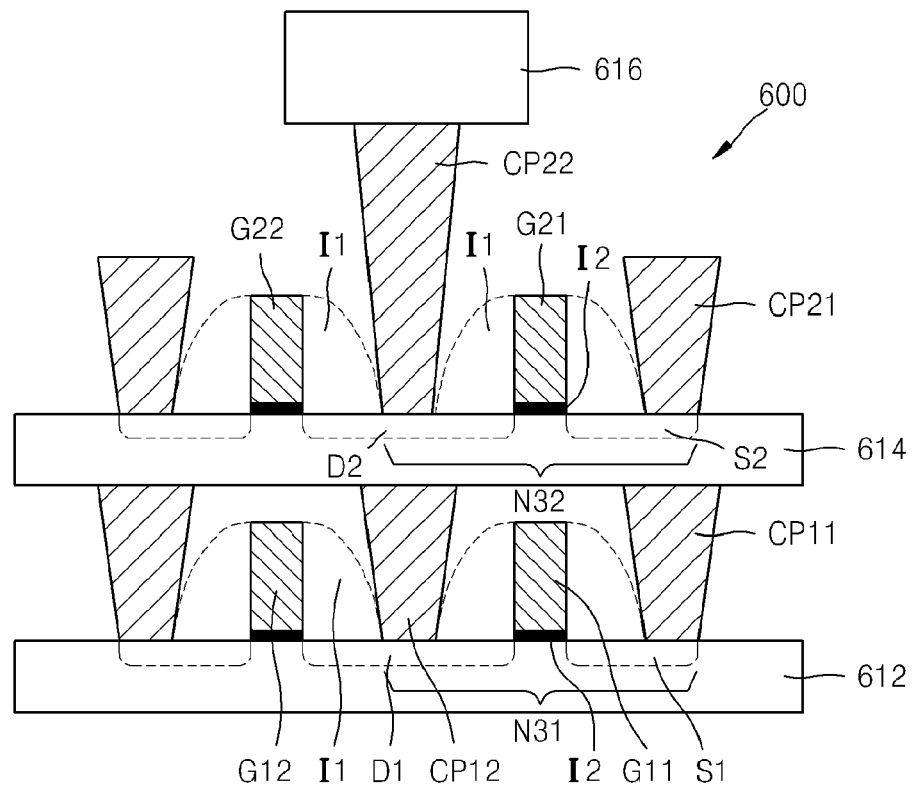
FIG. 6A is a cross-sectional view of a phase-change memory cell according to an embodiment of the present invention.
Figure 6B:
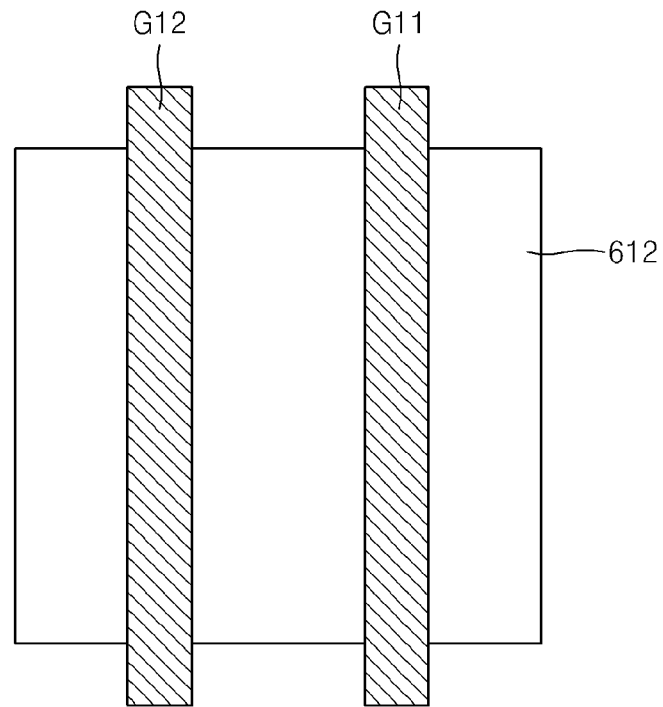
FIG. 6B is a plan view of a first control transistor of the phase-change memory cell of FIG. 6A.
Figure 6C:
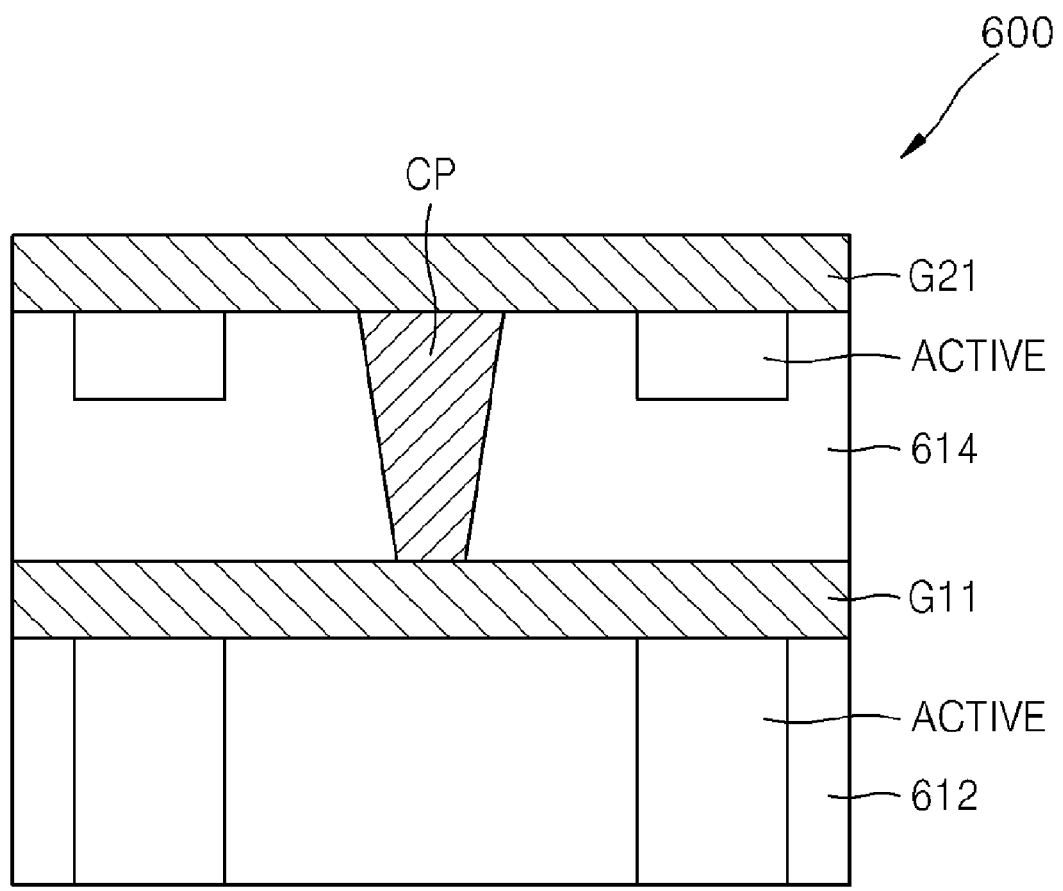
FIG. 6C is a side view of the phase-change memory cell of FIG. 6A.

FIG. 6A is a cross-sectional view of a phase-change memory cell 600 according to an embodiment of the present invention. FIG. 6B is a plan view of a first control transistor N31 of the phase-change memory cell 600 of FIG. 6A. FIG. 6C is a side view of the phase-change memory cell 600 of FIG. 6A.

Referring to FIG. 6A, the phase-change memory cell 600 includes a plurality of the first control transistors N31, each formed on a first substrate 612 and having a source S1, a gate G11, and a drain D1; a second substrate 614 formed on the first control transistors N31; a plurality of second control transistors N32, each formed on the second substrate 614 and having a source S2, a gate G21, and a drain D2; and a variable resistance device 616 connected to one of the source S2, the gate G21, and the drain D2 of one of the second control transistor N32 and formed of a phase-change material.

FIG. 6A illustrates that two of each of the first and second control transistors N31 and N32 are formed on the first and second substrates 612 and 614, respectively, for convenience. However, according to the present invention, there is no limit on both the number of the first control transistors N31 to be formed on the first substrate 612 and the number of the second control transistors N32 to be formed on the second substrate 614.

The phase-change memory cell 600 of FIG. 6A corresponds to a cross-section of the phase-change memory cell 30 illustrated in FIGS. 3 and 4 during manufacture of the phase-change memory cell 30.

The source S1 of the first control transistor N31 is electrically connected to the source S2 of the second control transistor N32, and the drain D1 of the first control transistor N31 is electrically connected to the drain D2 of the second control transistor N32.

These electrical connections are provided via contact plugs CP11 and CP12. Specifically, the source S1 of the first control transistor N31 is connected to the contact plug CP11 which is connected to the second substrate 614. Also, the source S2 of the second control transistor N32 is connected to the contact plug CP21.

Similarly, the drain D1 of the first control transistor N31 is connected to the contact plug CP12 which is connected to the second substrate 614. Also, the drain D2 of the second control transistor N32 is connected to the contact plug CP22.

The contact plugs CP11, CP21, CP12, and CP22 are conductive layers that allow conduction of electricity.

The gate G11 of the first control transistor N31 is electrically connected to the gate G21 of the second control transistor N32. This electric connection is performed via a contact plug CP (not shown in FIG. 6A) of FIG. 6C. In FIG. 6A, I1 denotes an insulating material, and I2 denotes a dielectric layer.

The first and second control transistors N31 and N32 of FIG. 6A have a planar transistor structure. A planar transistor is a transistor whose gate is formed on a substrate. FIG. 6B is a plan view of the first control transistor N31 which is the planar transistor. Referring to FIG. 6B, gates G11 and G12 are formed on the first substrate 612.

FIG. 6C is a side view of the phase-change memory cell 600 of FIG. 6A. Referring to FIG. 6C, the gate G11 of the first control transistor N31 and the gate G21 of the second control transistor N32 are formed horizontally on the first and second substrates 612 and 614, extending the full width at the phase-change memory cell 600. The gates G11 and G21 are electrically connected via the contact plug CP.

In addition, an active region ACTIVE, i.e., a source and drain region, is formed in each of the first and second substrates 612 and 614.

Figure 7A:
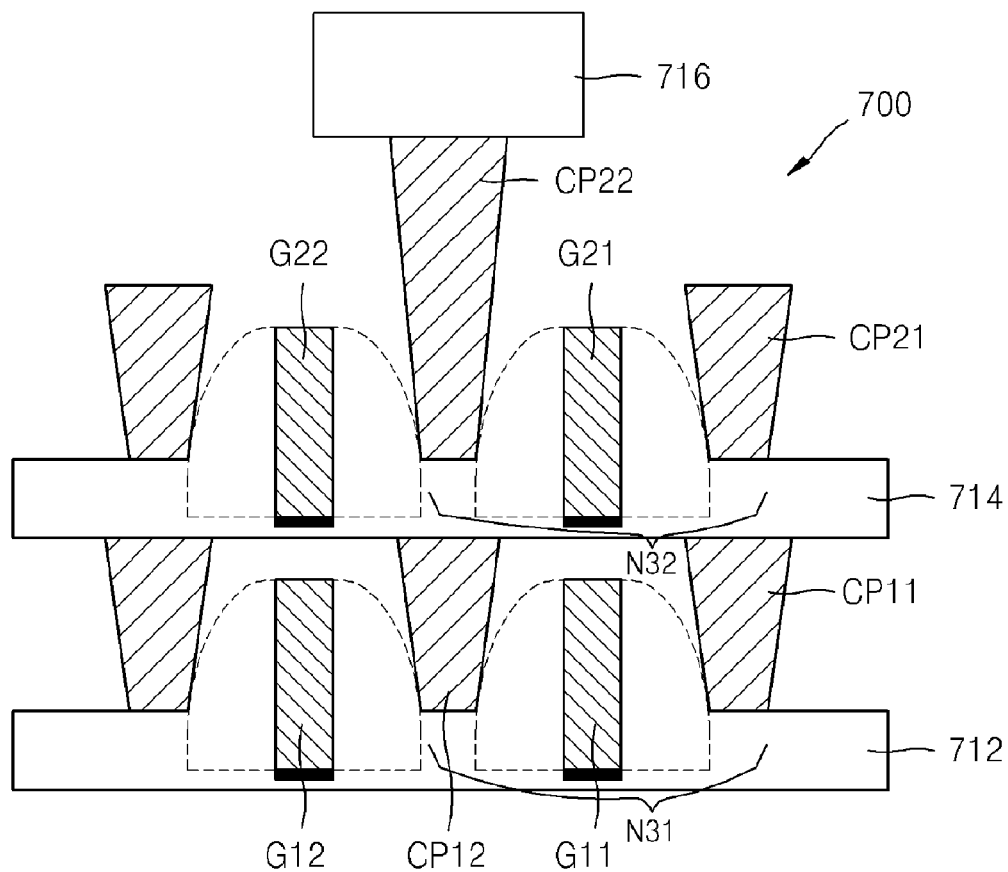
FIG. 7A is a cross-sectional view of a phase-change memory cell according to another embodiment of the present invention.

FIG. 7A is a cross-sectional view of a phase-change memory cell 700 according to another embodiment of the present invention. The construction of the phase-change memory cell 700 is the same as that of the phase-change memory cell 600 of FIG. 6A, except that a plurality of first and second control transistors N31 and N32 have a Fin Field Effect Transistor (FinFET) structure.

That is, the first control transistors N31 are formed on a first substrate 712 and a second substrate 714 is formed on the first control transistors N31. The second control transistors N32 are formed on the second substrate 714.

A variable resistance device 716 is connected to drains of the first and second control transistors N31 and N32 via contact plugs CP12 and CP22, respectively. Also, sources of the first and second control transistors N31 and N32 are electrically connected via contact plugs CP11 and CP21.

The FinFET has a structure in which gate electrodes are formed along both sides of a channel, and, thus the gate electrodes have long channel lengths, thereby suppressing the short-channel effect.

Figure 7B:
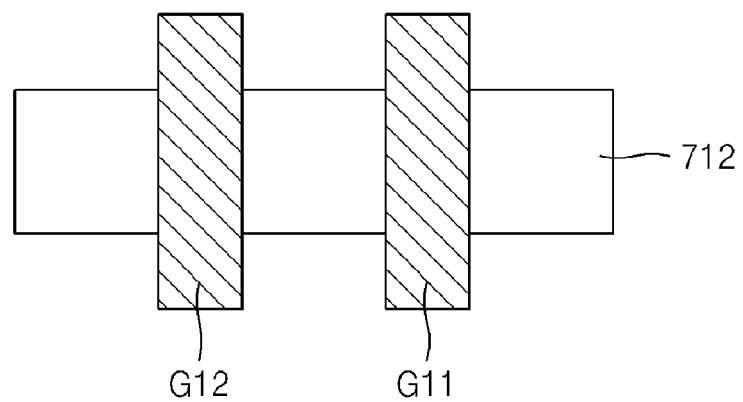
FIG. 7B is a plan view of a first control transistor of the phase-change memory cell of FIG. 7A.

FIG. 7B is a plan view of the first control transistor N31 of the phase-change memory cell 700 of FIG. 7A. FIG. 7B illustrates that the first substrate 712 is smaller in area than the first substrate 612 of FIG. 6B, since the FinFET is used as the first control transistor N31 in the present embodiment.

Figure 7C:
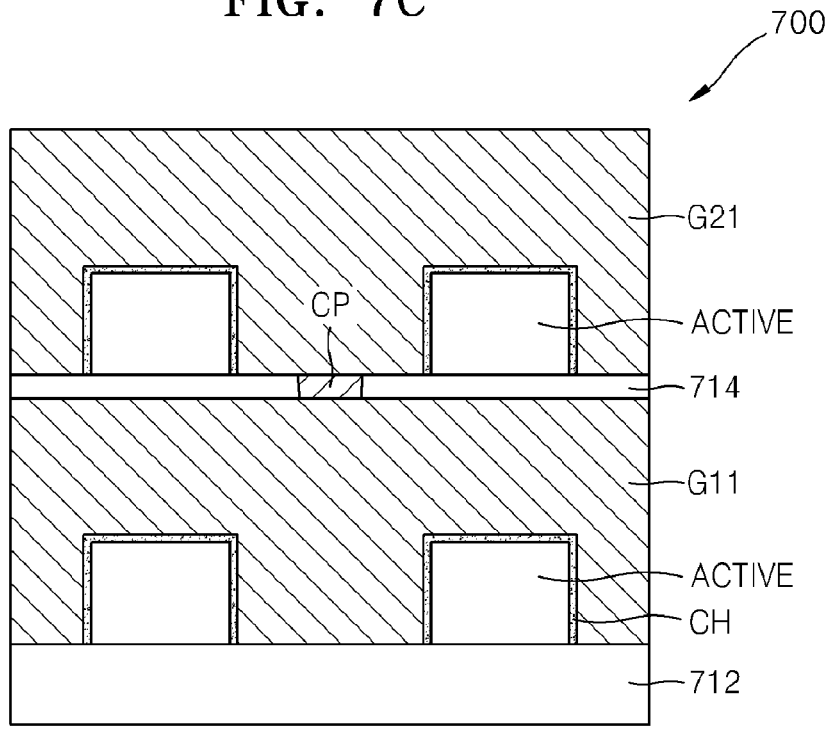
FIG. 7C is a side view of the phase-change memory cell of FIG. 7A.

FIG. 7C is a side view of the phase-change memory cell 700 of FIG. 7A. As compared in the side view of FIG. 6C, the gates G11 and G21 of the first and second FinFETs control transistors N31 and N32 are formed to enclose active areas ACTIVE, thereby elongating channels CH of the gates.

Figure 7D:
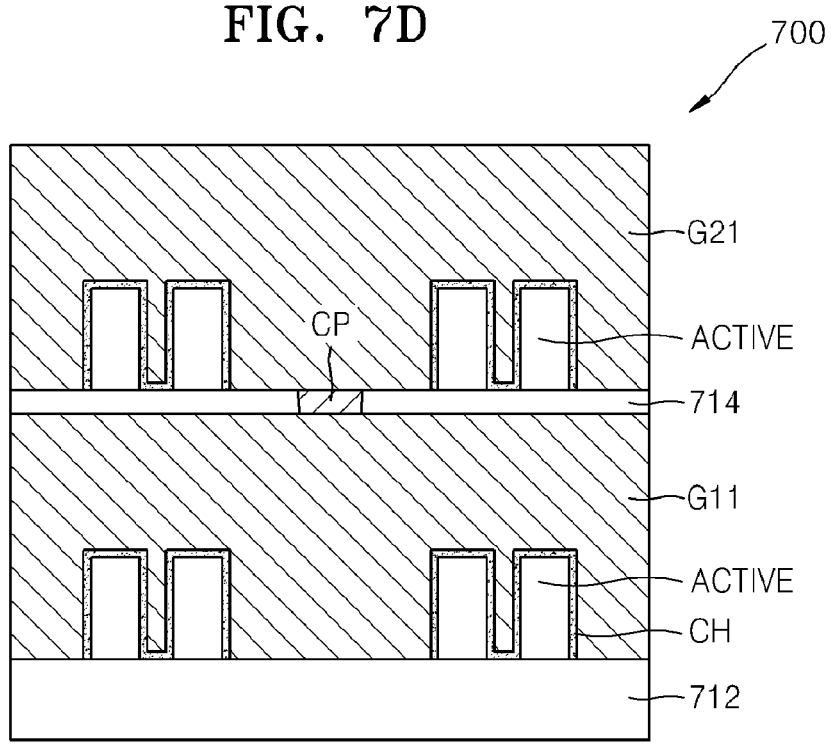
FIG. 7D is a side view of a phase-change memory cell according to another embodiment of the present invention.

Alternatively, the first and second control transistors N31 and N32 may have a Multi-Channel Field Effect Transistor (McFET) structure. FIG. 7D is a side view of a phase-change memory cell according to another embodiment of the present invention. The McFET is illustrated in FIG. 7D.

The structure of the McFET is similar to that of the FinFET but is different from the FinFET in terms of the active areas ACTIVE as illustrated in FIG. 7D. That is, the active areas ACTIVE of FIG. 7D are formed in different manner from those of FIG. 7C so as to make the channels CH longer.

As described above, first and second control transistors of a phase-change memory cell according to the present invention may have a planar transistor structure, a FinFET structure, or a McFET structure.

Figure 8A:
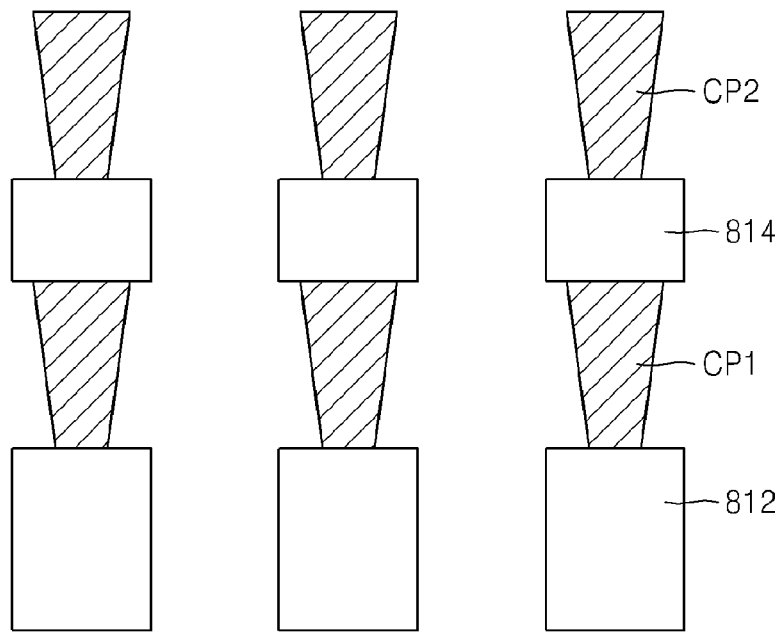
FIG. 8A is a diagram illustrating connection of contact plugs to substrates such as those illustrated in FIG. 6A or 7A, according to an embodiment of the present invention.

FIG. 8A is a diagram illustrating connection of contact plugs to first and second substrates 812 and 814, respectively, such as those shown in FIGS. 6A and 7A, according to an embodiment of the present invention. Referring to FIG. 8A, a contact plug CP1 is connected to the top of the first substrate 812 and the bottom of the second substrate 814. A contact plug CP2 is connected to the top of the second substrate 814. Also, the contact plug CP2 may be connected to an external power source, e.g., a ground voltage source.

However, electrical connection of the first substrate 812 to an external power source causes contact resistance on the contact surfaces of the contact plugs CP1 and CP2 and the first and second substrates 812 and 814. Accordingly, it is desired that the contact resistance be mitigated.

Figure 8B:
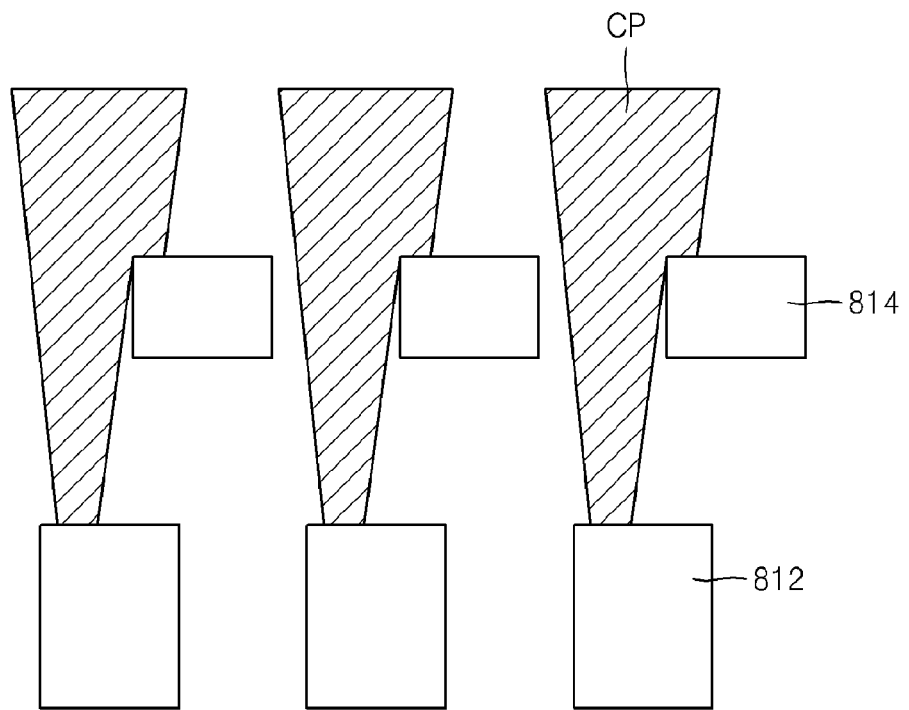
FIG. 8B is a diagram illustrating connection of contact plugs to substrates, which reduces contact resistance, according to another embodiment of the present invention.

FIG. 8B is a diagram illustrating connection of contact plugs to substrates, which reduces contact resistance, according to another embodiment of the present invention.

The second substrate 614 of the phase-change memory cell 600 illustrated in FIG. 6A and the second substrate 714 of the phase-change memory cell 700 illustrated in FIG. 7A are arranged to be in parallel with, and partially overlap, the first substrate 612 and the first substrate 712, respectively.

Specifically, referring to FIG. 8B, the second substrate 814 is slightly diagonally moved to the left or right side of the first substrate 812, perpendicular to the first substrate 812. The contact plug CP is formed of a conductive layer connected to but not separated by the second substrate 814, and extends from an external power source (not shown) to the first substrate 812. Accordingly, it is possible to significantly reduce the contact resistance.

Referring back to FIGS. 6A and 7A, the contact plugs CP12 and CP22 that connect the variable resistance devices 616 and 716 to the drain D1 of the first control transistor N31, and the contact plugs CP11 and CP12 that connect the external power source to the source S1 and the drain D1 of the first control transistor N31 are formed of a conductive layer connected to but not separated by the second substrates 614 and 714.

FIGS. 9A through 9D are cross-sectional views illustrating a method of fabricating a phase-change memory cell according to an embodiment of the present invention. First, referring to FIG. 9A, a first control transistor N31 having a source, gate, and drain is formed on a first substrate 912, a gate G11 is enclosed by an insulting material I1 and a bottom of the gate G11 is coated with a dielectric layer I2.

Figure 9A:
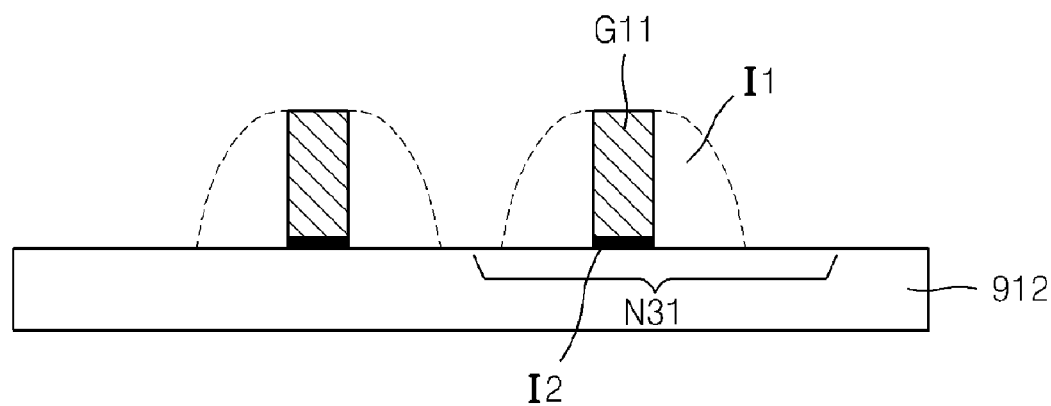
FIGS. 9A through 9D are cross-sectional views illustrating a method of fabricating a phase-change memory cell according to an embodiment of the present invention.
Figure 9B:
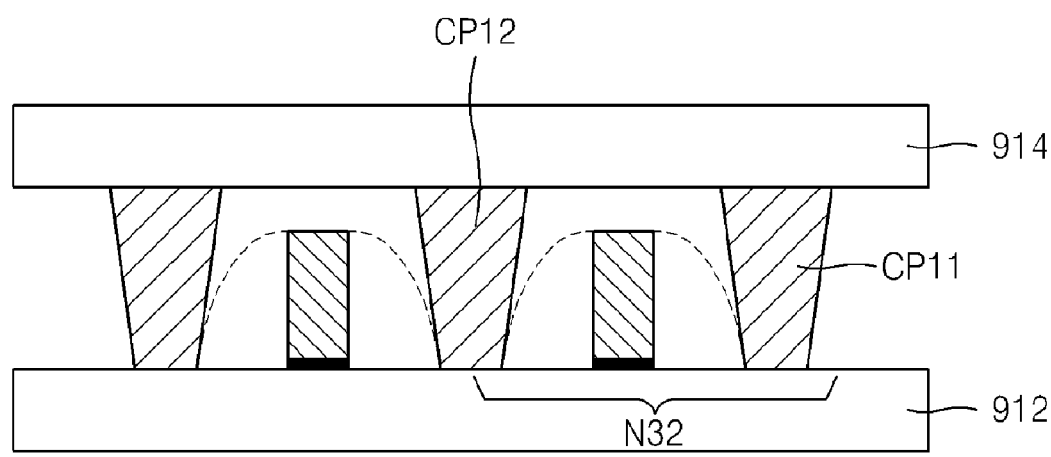

Next, referring to FIG. 9b, a second substrate 914 is formed on the first control transistor N31, and contact plugs CP11 and CP12 are formed on the first substrate 912, and contact the second substrate 914.

Figure 9C:
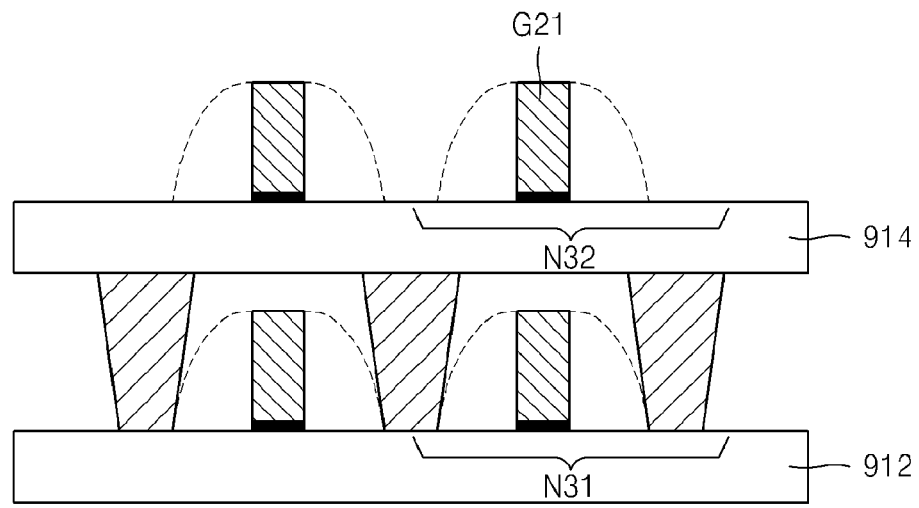
Figure 9D:
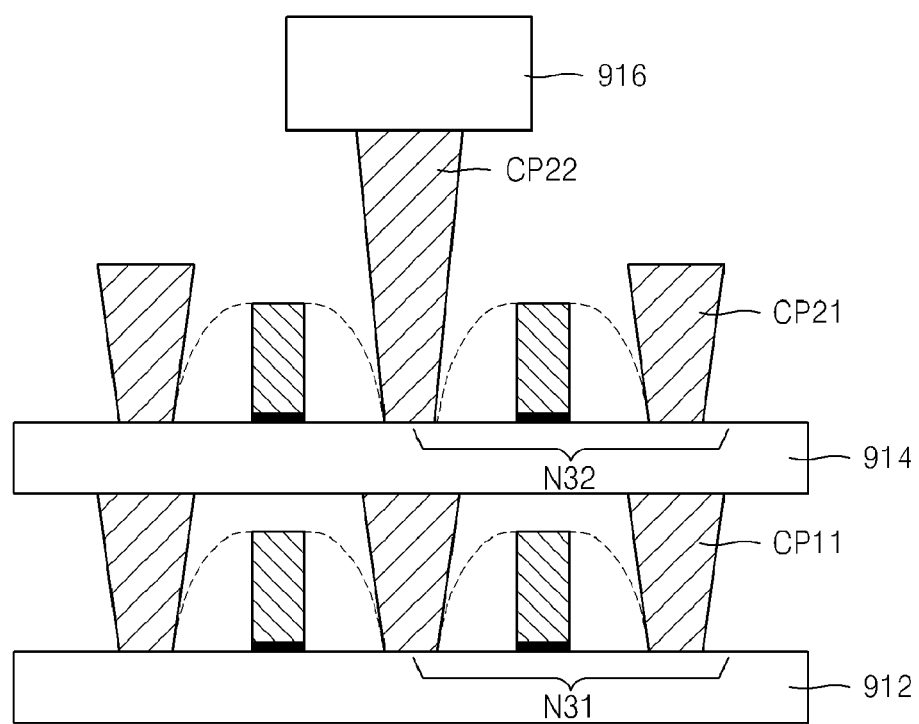

Next, referring to FIG. 9C, a second control transistor N32 having a source, gate, and drain is formed on the second substrate 914. Lastly, referring to FIG. 9D, contact plugs CP21 and CP22 are formed on the second substrate 914, and a variable resistance device 916 formed of a phase-change material is connected to one of the source and drain of the second control transistor N32 via the contact plug CP22.

The method illustrated in FIGS. 9A through 9D may further include forming a contact plug that connects the variable resistance device 916 to the source or the drain of the first control transistor N31, and a contact plug that connects an external power source to the source or the drain of the first control transistor N31, as illustrated in FIG. 8B.

The construction of the phase-change memory cell obtained according to the method of FIGS. 9A through 9D have been described above.

The inventive concepts discussed above can be used in conjunction with other resistance based memory and resistance based memory arrays. For example, a resistance based memory can be a PRAM (phase change material RAM), RRAM (resistive RAM), MRAM (magnetic RAM), Racetrack Memory of International Business Machines (IBM) Corporation of Armonk, N.Y., USA, Magnetic Packet Memory (MP Memory) of Samsung Co., Ltd, of Gyeonggi-do, Republic of Korea or other resistance based memory.

There are numerous types of non-volatile memory. A newer type of non-volatile memory is a resistive material based memory and memory array. For example, PRAMs rely on the application of joule heat to change a resistive state of a phase-change material of a phase change resistor cell. Typically, a current is supplied to the phase change resistor cell to generate the joule heat. The amount and duration of the current establishes a quantity of joule heat, which can change the resistive state of a phase-change memory material of the phase-change resistor cell. The phase-change resistor cell can have a low resistance state or a high resistance state depending on the amount and duration of joule heat applied to the phase-change resistor cell. The low resistive state is called a set state and may represent, for example, a logic zero state (e.g. '0'). The high resistive state is called a reset state, and may represent, for example, a logic high state (e.g. '1'). A GST or a chalcogenide alloy of germanium, antimony and tellurium (GeSbTe) are common phase change materials used in phase change resistor cells.

Information storing devices can be classified as either volatile information storing devices or non-volatile information storing devices. Volatile information storing devices require power to maintain stored information. Dynamic random access memory (DRAM), double data rate synchronous dynamic random access memory (DDR SDRAM), static random access memory (SRAM), zero capacitor RAM (Z-RAM), and Twin Transistor RAM (TTRAM) are types of volatile information storing devices. Typically, volatile information storing devices have higher writing and reading speeds than non-volatile information storing devices; however, stored information is erased when power is removed from volatile information storing devices. Unlike volatile information storing devices, non-volatile information storing devices can retain stored information when power is turned off. Read only memory (ROM), Ferroelectric RAM (FeRam), MRAM, PRAM, RRAM, Racetrack memory, and Nano-RAM (NRAM) are types of non-volatile information storing devices. Non-volatile information storing devices are typically used for secondary storage or long-term persistent storage, since stored information is not erased when power is turned off.

A DRAM is an example of a conventional volatile information storing device. A hard disk drive (HDD) and a random access memory (RAM) are examples of conventional non-volatile information storing devices. A magnetic random access memory (MRAM), which is a type of non-volatile information storing device, uses magnetization to store information while conventional memory utilizes electric charge.

MRAM devices use a magneto-resistance effect based on a spin dependent electron transport phenomenon to store information or data. A MRAM stores digital data, represented as '0' and '1', based on the resistive state of a magnetic tunnel junction (MTJ). Data or information stored in an MRAM cell can be determined based upon the magnetization direction within a free layer of a MTJ.

MRAMs utilize the magneto-resistance effect to store information in a magnetic storage element. A magnetic storage element can be formed of two ferromagnetic plates, which are separated by a thin insulating layer. One of the two ferromagnetic plates can have a particular polarity, while the polarity of the other ferromagnetic plate can be changed to match that of an external magnetic field. A MRAM that utilizes the magneto-resistance effect can change, for example, a resistance of an electrically conductive material based on a circumferential magnetic field.

Further, an MRAM device can include a plurality of MRAM cells composed of magnetic tunnel junctions (MTJs) on a single transistor. A MTJ can be composed of multiple thin layers such that electrons may cause tunneling through a very thin insulating layer sandwiched between two ferromagnetic electrodes when an external electrical signal is applied thereto. A tunneling current of the MTJ depends on the orientation of magnetizations of the two ferromagnetic layers. The orientation of the magnetization of the ferromagnetic layers can be changed by an applied magnetic field, by a phenomenon called tunneling magneto-resistance (TMR). TMR is a change of the tunneling current in an MTJ when relative magnetizations of the two ferromagnetic layers change their alignment. For example, when the magnetization of the two ferromagnetic layers are in parallel, electrons can tunnel through the MTJ, from the first ferromagnetic layer to the second ferromagnetic layer, due to unoccupied states in the second ferromagnetic layer. However, when the two ferromagnetic layers are anti-parallel, electron tunneling is suppressed.

Figure 17:
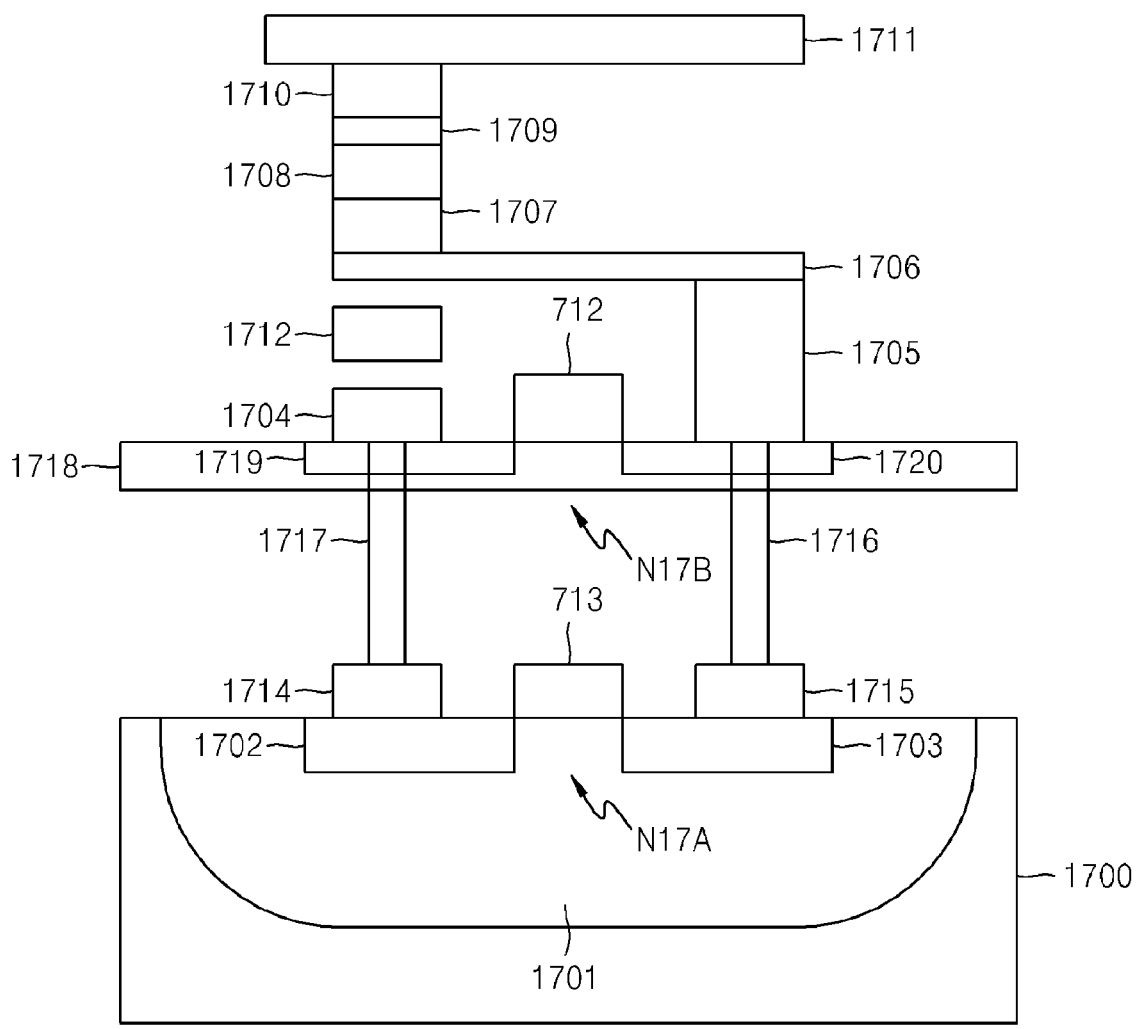
FIG. 17 is a diagram illustrating an MRAM cell according to an embodiment of the present invention.

FIG. 17 is a diagram illustrating an MRAM cell according to an embodiment of the present invention. An MRAM cell comprises an MTJ formed on a dual transistor structure. The MRAM cell comprises first and second control transistors N17A, N17B on different layers. The first control transistor is formed on a substrate 1700 having doped source/drain regions 1702, 1703. The source/drain regions of the first control transistor N17A can be formed in a doped well 1701, which is formed in the substrate 1700. The second control transistor is formed on a second layer 1718 having doped source/drain regions 1719, 1720. The source/drain regions 1702, 1703 of the first control transistor N17A are connected to the source/drain regions 1719, 1720 of the second control transistor N17B via contact plugs 1716, 1716.

In one embodiment, the first control transistor N17A is a bulk transistor and the second control transistor N17B is a thin layer transistor formed in the second layer 1718. In another embodiment, a third control transistor (not shown) is formed on the second control transistor N17B.

The MTJ comprises a pinned layer 1708, a non-magnetic layer 1709, and an information storage layer 1710. The non-magnetic layer 1709 can be a thin insulating layer and the information storage layer 1710 can be a free layer. When magnetization directions within the free layer and the pinned layer are arranged parallel to each other, a tunneling current flowing through the MTJ has its maximum value. That is, the tunneling resistance has its minimum value. In contrast, when the magnetization directions within the free layer and the pinned layer are arranged anti-parallel to each other, the tunneling current flowing through the MTJ has its minimum value. That is, the tunneling resistance has its maximum value.

An anti-ferromagnetic layer 1707, which is referred to as a pinning layer, is added to the pinned layer 1708. The pinning layer operates to fix the magnetization direction of the pinned layer. That is, the pinned layer attached to the pinning layer has a large switching field, and the magnetization direction of the pinned layer is fixed in a constant direction when an applied magnetic field is smaller than the switching field. The magnetization direction of the free layer can be changed by applying a magnetic field to a circumference or perimeter of the MTJ. In order to change the magnetization direction of the free layer to a desired direction, conductive layers such as a bit line 1711 and a word line 1712 are formed to be orthogonal to each other above and below the MTJ. A magnetic field is generated by a current flowing through each of the conductive layers 1611, 1712. Alternatively, a current supplied by the first and second transistors N17A, N17B can change the magnetization direction of the free layer of the MTJ by using a spin transfer torque (STT) phenomenon.

The MRAM cell further comprises conductive layers 1704, 1705, 1706, 1712, 1713, 1714, 1715. In addition, a bottom electrode can be between the anti-ferromagnetic layer 1707 and the conductive layer 1706, and a top electrode can be between the information storage layer 1710 and the conductive layer 1711. The conductive layer 1704 can be connected to a high power voltage, and the conductive layers 1705, 1706 can be connected to the MTJ. The conductive layers 1712, 1713 can be read word lines of the device.

In an embodiment, an MRAM array is provided. The MRAM array comprises a plurality of MRAM cells, also referred to as unit cells. The unit cells are connected to form a plurality of columns. A group of reference cells are aligned in a reference column. For example, when a unit cell of a particular column is selected for a read operation, a signal of the selected unit cell is compared with a signal of a reference unit cell in the reference column positioned in the same row. A comparator compares the signal of the reference unit cell with the signal of the selected unit cell to output a binary bit of '0' or '1'. The reference cells are used as a reference for data values stored in the unit cells.

During a data read process, an output selection decoder supplies power to an output selection line (e.g. word line) connected to the unit cell. A unit cell is selected by a data output selection switch on the unite cell. Power is subsequently supplied to a bit line, and a resistance of the MTJ is determined by the flow quantity of current through the MTJ of the selected unit cell.

During a data write process, an input selection decoder supplies power to an input selection line connected to the unit cell to turn on a data input selection switch. A current is supplied to the unit cell through a data input line to determine the magnetization direction of a free layer of a data storage element. The data input line is electrically connected to both sides of the free layer of each unit cell. In the data write process, data is stored in the data storage element according to the magnetization direction of the free layer. MRAM devices and methods of operating MRAM devices are described, for example, in Park, et al, U.S. Pat. No. 6,781,871, incorporated herein by reference, in its entirety. When a magnetization direction of a selected MRAM cell is changed, a magnetization of surrounding non-selected MRAM cells should not be changed. That is, when the magnetization direction of a selected MTJ of the MRAM cell is changed, the magnetization direction of non-selected surrounding MTJs of the array of MRAM cells should not be changed. However, in order to enhance the integration density of MRAMs, the size of MTJs should be decreased, and the spacing between MTJs should also be decreased. However, due to the decreased spacing between the MTJs, the magnetic field generated to change the magnetization direction of a selected MTJ can affect surrounding non-selected MTJs. When this effect becomes severe enough to invert the magnetization direction of the surrounding MTJs, a normal data storage operation cannot be employed.

To address the abovementioned limitations, another writing method referred to as toggle switching has been proposed. A writing method for an MRAM device employing toggle switching is disclosed in Savchenko, et al., U.S. Pat. No. 6,545,906, incorporated herein by reference, in its entirety.

According to U.S. Pat. No. 6,545,906, a digit line is positioned on a predetermined region of a semiconductor substrate and a word line is positioned above the digit line and crosses the digit line. In this example embodiment, the word line is substantially the same as a bit line. Further, an MTJ is interposed at an interconnection between the digit line and the bit line at an angled direction of 45°. The MTJ includes a second magnetic region, a tunneling barrier, and a first magnetic region which are sequentially stacked. Each of the first and second magnetic regions have synthetic anti-ferromagnetic (SAF) structures. The SAF structure is composed of a top ferromagnetic layer, a bottom ferromagnetic layer, and an anti-ferromagnetic coupling spacer layer interposed therebetween.

Conventional magnetic memory devices switch a magnetization direction of a free layer of a memory cell using a magnetic field generated by a current flowing through a bit line and a word line. However, when the size of a unit cell is decreased to realize a relatively high-density memory device, the coercivity of the free layer increases. As a result of the increased coercivity, a switching field of the free layer increases. Thus, the magnitude of an applied current must be increased in order to switch the magnetization direction of the free layer. Moreover, because a relatively large number of memory cells are included in a memory array structure, free layers of adjacent cells may switch even when not selected. Accordingly, conventional magnetic memory devices that switch the magnetization direction of the free layer using a magnetic field generated by a current flowing through a bit line and a word line have relatively low selectivity, and, for this reason, have limited application in high-density memory devices.

Magnetic memory devices that use a spin transfer torque (STT) phenomenon or Spin Transfer Switching may address the above-discussed drawbacks of high density and selectivity, and thus, many studies have been conducted on magnetic memory devices using the STT phenomenon. In this conventional method, a magnetization direction of a free layer of a magnetic memory device is switched to a desired direction using a spin transfer of electrons, by allowing a current in which elections are polarized (e.g. spin-aligned) in a predetermined direction to flow in the magnetic memory device. This conventional method is advantageous for increasing selectivity of memory cells; however, SST requires a higher magnitude of current to flow through a control transistor than conventional toggle switching methods. Accordingly, the size of control transistors of the memory cells cannot be decreased.

Floating-gate type non-volatile memory devices and charge-trap type non-volatile memory devices are described, for example, in Chen, et al., U.S. Pat. No. 6,522,580, incorporated herein by reference, in its entirety.

The unit cell of a typical floating-gate type non-volatile memory device includes a tunnel oxide layer, a floating gate, a dielectric layer and a control gate sequentially formed on a semiconductor substrate. The unit cell of a floating-gate type non-volatile memory device stores information by charging/discharging electrons into/out of a floating gate of a unit cell.

Typical floating-gate storage devices operate in a binary mode, where each floating-gate transistor stores a single bit of data. That is, the threshold level of each floating-gate transistor has two threshold levels. However, to further increase the data storage density of floating-gate type memory devices, floating-gate transistors having more than two threshold levels have been developed. For example, a floating-gate transistor having 4 threshold levels can store 2 bits of data. Memory cells storing more than 1 bit of data are also refereed to as multi-level cells (MLC).

In contrast, the unit cell of a typical charge-trap type non-volatile memory device includes a tunnel insulation layer including silicon oxide, a charge-trapping layer such as silicon nitride, a blocking layer such as silicon oxide, and an electrode such as doped polysilicon sequentially formed on a semiconductor substrate. In the typical charge-trap type non-volatile memory device, information can be programmed in the charge-trap type non-volatile memory device by storing electrons in the charge-trapping layer between the electrode and a semiconductor substrate. Information can be erased from the charge-trap type non-volatile memory device by discharging the electrons stored in the charge-trapping layer.

Three-dimensional (3D) non-volatile memory cells and memory arrays are described, for example, in Johnson, et al, U.S. Pat. No. 6,351,406, incorporated herein by reference, in their entirety. According to U.S. Pat. No. 6,351,406, a 3D non-volatile memory cell comprises an input terminal and an output terminal. The non-volatile memory cell further comprises a steering element and a state change element connected in series between the input terminal and the output terminal of the non-volatile memory cell. The input terminal, output terminal, steering element, and state change element can be disposed above a substrate, and peripheral circuitry can be deposited in the substrate. The steering element and the state change element can be vertically stacked in a "pillar shape." Further, memory cells can be arranged in a cross-point memory array.

Cross-point memory arrays use transverse addressing lines, such as row and column lines, with intervening programmable material. Examples of cross-point memory devices include magnetic tunnel junction memory devices, resistive random access memory devices, ferroelectric random access memory devices, silicon oxide nitride oxide (ONO) semiconductor memory devices, polymer memory devices, and phase change memory devices.

In one embodiment of U.S. Pat. No. 6,351,406, a pillar contains four layers of material in a layer stack, and is deposited between an upper conductive layer and a lower conductive layer. In addition, the pillars can be stacked directly above one another to form cell stacks. Further, a plurality of wafers can be stacked on one another to form a wafer stack, and diced to form multiple-layered devices.

Recently, resistive memory devices with high capacity, capable of operating at a relatively low voltage have been developed. Resistive memory devices are also referred to as "resistive RAM", "ReRAM" or "RRAM". RRAM takes advantage of controllable resistance changes in thin films of variable resistance material, such as thin binary metal oxide films. Integrated circuit resistive memory devices are described, for example, in Hsu et al., U.S. Pat. No. 6,849,891 and Kim et al., U.S. Pat. No. 7,282,759, each incorporated herein by reference, in their entirety.

Figure 10:
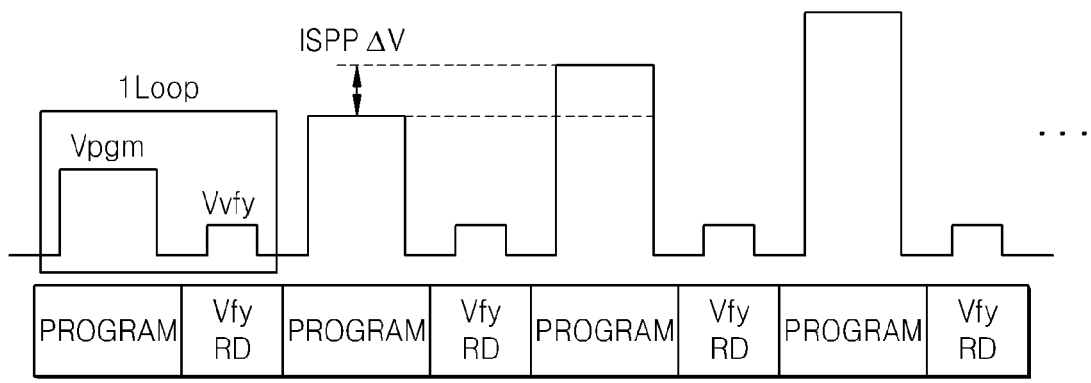
FIG. 10 is a diagram illustrating a program loop of a programming operation including a plurality of unit program loops using an incremental program pulse (ISPP) method.

FIG. 10 is a diagram illustrating a program loop including a plurality of unit program loops using an incremental program pulse (ISPP) method. It will further be appreciated that the write operation in any of the above memory device embodiments can be performed in conjunction with an incremental program pulse (ISPP) method. For example, one unit program loop 1Loop can include a program operation and a verify read operation. In the program operation, a program voltage or voltage waveform Vpgm can be applied to a selected word line. While shown as a simple square wave, it will be appreciated that the program voltage waveform may be of a shape to either set or reset a phase change material in a PRAM cell or a resistive-change element in a resistive-change memory cell. In the verify read operation, a verify voltage Vvfy may be applied to the selected word line and a read voltage Vread may be applied to the unselected word lines. In ISPP methods, the program voltage Vpgm can be increased by a delta voltage ΔV for each unit program loop. Once the verify read operation verifies that data has been properly written, the program loop ends, and the write operation ends. That is, until the write operation is verified, the write operation is not complete. It will be understood that FIG. 10 is but one example an ISPP method and that any ISPP method may be used in a write operation in conjunction with the memory devices described herein.

Still further, it will be appreciated that the memory cells may serve as multi-level cells (MLC). Unlike convention memory cells that have set and reset states, MLCs can have more than set and reset states. That is, MLCs can be programmed to states between set and reset states. MLCs having more than set and reset states can store more than 1 bit of data. For example, if four states exist, each state may represent two bits of data.

It will further be appreciated that resistance based memory and resistance based memory arrays as described herein can be used in conjunction with memory cards, computers, digital cameras, and other electronic devices requiring non-volatile memory storage.

Figure 11:
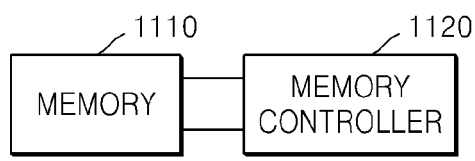
FIG. 11 is a diagram illustrating a memory device connected to a memory controller according to an embodiment of present invention.

FIG. 11 is a diagram illustrating a memory device connected to a memory controller according to an embodiment of the present invention. A memory device 1110 is connected to a memory controller 1120. For example, the memory controller 1120 can supply command, control, and address signals to the memory device 1110 for storage and retrieval of data supplied on a data bus.

Figure 12:
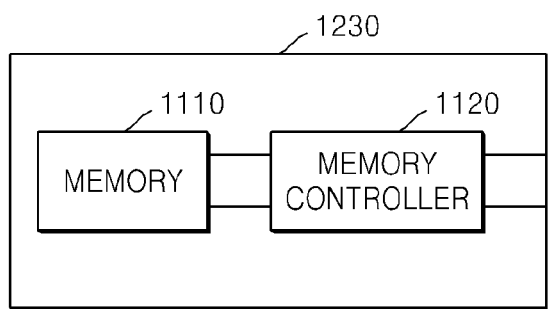
FIG. 12 is a diagram illustrating a memory card according to an embodiment of present invention.

FIG. 12 is a diagram illustrating a memory card according to an embodiment of the present invention. A memory card 1230 can comprise at least one memory device 1110 and a memory controller 1120. For example, the memory card 1230 can be a memory card such as a flash memory card, a USB memory card, or an express memory card. The memory card 1230 can also be a card meeting any industry standard for use with a consumer electronics device such as a digital camera, personal computer, or other electronic device require non-volatile memory storage. It will be appreciated that the memory controller 1120 can control the memory device 1110 based on control signals received by the card 1230 from another device (e.g., computer, digital camera, cell phone, other electronic devices).

Figure 13:
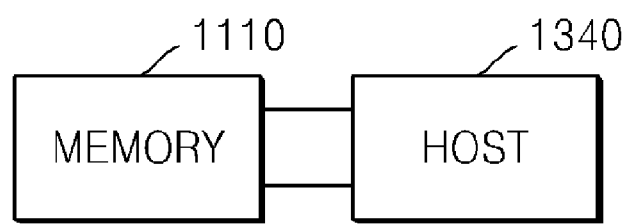
FIG. 13 is a diagram illustrating a memory device connected to a host system according to an embodiment of present invention.

FIG. 13 is a diagram illustrating a memory device connected to a host system according to an embodiment of the present invention. The memory device 1110 can be further connected to a host system 1340. The host system 1340 can be a processing system such as a computer, digital camera, cell phone, PDA, or other electronic device requiring non-volatile memory storage. The host system 1340 can use the memory device 1110 as a removable storage medium. It will be appreciated that the host system 1340 can supply input signals to the memory device 1110 for controlling operation of the memory device 1110. For example, the host system 1340 supplies command, control, and address signals to the memory device 1110 for storage and retrieval of data supplied on a data bus.

Figure 14:
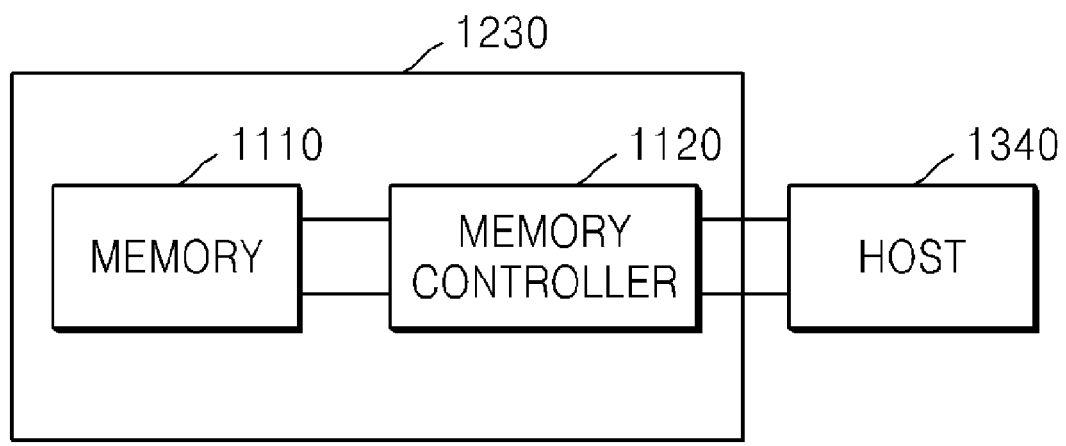
FIG. 14 is a diagram illustrating a memory card connected to a host system according to an embodiment of present invention.

FIG. 14 is a diagram illustrating a memory card connected to a host system according to an embodiment of the present invention. In another embodiment of the present invention, the memory card 1230 can be connected to the host system 1340. In this embodiment, the host system 1340 supplies command, control, and address signals to the memory card 1230 such that the memory controller 1120 controls operation of the memory device 1110.

Figure 15:
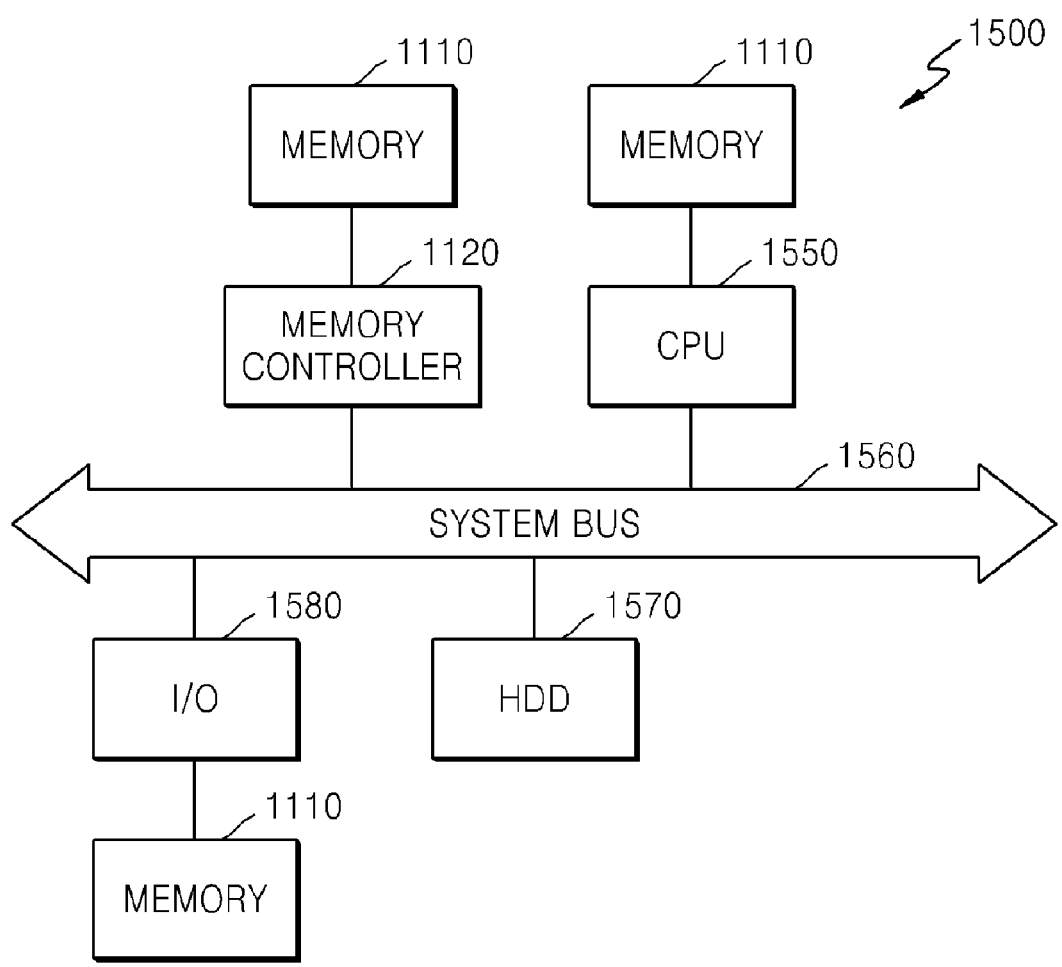
FIG. 15 is a diagram illustrating a computer system according to an embodiment of present invention.

FIG. 15 is a diagram illustrating a computer system according to an embodiment of present invention. As shown, the memory 1110 can be connected to a central processing unit (CPU) 1550 within a computer system 1500. For example, the computer system 1500 can be a personal computer, personal data assistant (PDA), cell phone, digital camera or other electronic device. The memory 1110 can be directly connected with the CPU 1550, connected via system bus 1560, or connected via an input/output controller 1580. It will be appreciated that the memory controller 1120 can be incorporated into the memory 1110. Further, It will be appreciated that the computer system 1500 of FIG. 15 does not illustrate the full complement of components that may be included within a computer system 1500 for the sake of clarity.

In these examples, the memory 1110 can be a resistance based memory, such as a PRAM (phase change material RAM), RRAM (resistive RAM), MRAM (magnetic RAM), Racetrack Memory of International Business Machines (IBM) Corporation of Armonk, N.Y., USA, Magnetic Packet Memory of Samsung Co., Ltd, of Gyeonggi-do, Republic of Korea or other resistance based memory configured with control transistors in accordance with embodiments of the present invention, for example, the embodiments described above in connection with FIGS. 3A. 3B, 4A, 4B.

Figure 16:
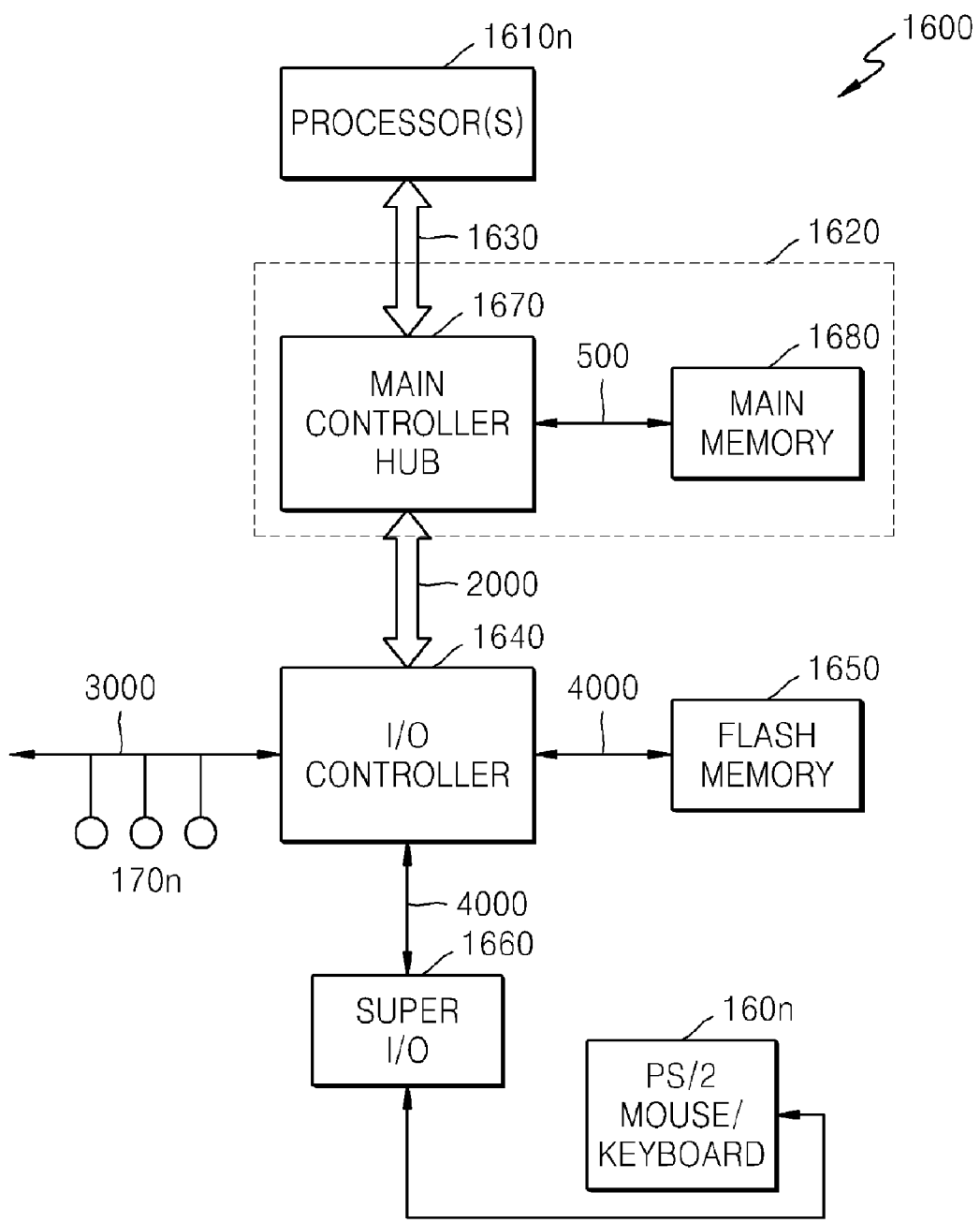
FIG. 16 is a diagram illustrating a computer system according to an embodiment of present invention.

FIG. 16 is a diagram illustrating a computer system according to an embodiment of present invention. A computer system 1600 (which can be a system commonly referred to as a "PC") can comprise a processor subsystem 1610$n$, a memory subsystem 1620 connected to the processor subsystem 1610$n$ by a front side bus 1630, an I/O controller 1640 connected to the memory subsystem 1620 by a hub link 2000 for providing an interface with peripheral buses such as a non-legacy Peripheral Component Interconnect (PCI) bus 3000, a flash memory 1650, and a super I/O 1660 connected thereto by a low pin count (LPC) bus 4000 for providing an interface with a plurality of I/O devices 160$n$. The computer system 1600 can be a desktop computer system, mobile computer system, laptop computer system, server computer system, or another type of electronic device requiring memory storage devices such as those described herein.

The processor subsystem 1610$n$ can include one or more processors or central processing units (CPUs) 1610$n$ such as Intel® i386, i486, Celeron® or Pentium® processors. The processor subsystem can also include one or more CPUs 1610$n$ such as a microcontroller (MCU), microprocessor (μP), or a digital signal processor (DSP).

The memory subsystem 1620 can include a main controller hub (MCH) 1670 connected to the host processors 1610$n$ by a front side bus 1630 (i.e., host bus or processor bus) and at least one memory device 1680 connected to the MCH 1670 by a memory bus 500. The memory device 1680 can preferably be a dynamic random-access-memory (DRAM), but may be substituted for read-only-memory (ROM), video random-access-memory (VRAM), or other memory devices. The memory element 1680 stores information and instructions such as an operating system (OS) for use by the host processors 1610*n*. Common operating systems such as Microsoft Windows operating systems, Unix operating systems and Linux operating systems can be employed. A graphics subsystem (not shown) can be connected to the main controller hub (MCH) 1670 of the memory subsystem 1620 by a graphics bus (not shown), and can include, for example, a graphics controller, local memory and a display device (e.g., cathode ray tube, liquid crystal display, flat panel display, plasma display, LCD projector etc.).

The I/O controller 1640 can operate as an interface between the front side bus 1630 and peripheral buses such as a non-legacy Peripheral Component Interconnect (PCI) bus 3000, a low pin bus 4000, a universal serial bus (USB) (not shown), a Serial Advanced Technology Attachment (SATA) bus (not shown), or other types of peripheral bus.

The PCI bus 3000 can be a high performance 32 or 64 bit synchronous bus with automatic configurability and multiplexed address, control and data lines as described in the "PCI Local Bus Specification, Revision 2.1" set forth by the PCI Special Interest Group (SIG) on Jun. 1, 1995, or the latest version "PCI Local Bus Specification, Revision 2.2" published on Dec. 18, 1998 for add-on arrangements (e.g., expansion cards) with new video, networking, or disk memory storage capabilities. Other types of bus architecture such as an Industry Standard Architecture (ISA) bus, Express PCI and Extended Industry Standard Architecture (EISA) bus may also be utilized.

A flash memory 1650 (e.g., EPROM) can be connected to the I/O controller 1640 via a low pin count (LDC) bus 4000. The flash memory 1650 can also store an operating system (OS), a set of system basic input/output start up (BIOS) instructions at startup of the computer system 1600 and ACPI instructions implemented to provide various power saving functions, and manage the progress of power saving between full-on, standby, and sleep mode. Alternatively, the operating system (OS), the BIOS instructions and the ACPI instructions may be stored in the memory 1680 of the memory subsystem 1620.

The super I/O 1660 can provide an interface with another group of I/O devices 160*n*, including, for example, a keyboard controller for controlling operations of an alphanumeric keyboard, a cursor control device such as a mouse, track ball, touch pad, joystick, etc., a mass storage device such as magnetic tapes, hard disk drives (HDD), and floppy disk drives (FDD), and serial and parallel ports to printers, scanners, and display devices.

One or more PCI 2.1/2.2 compliant peripheral devices 170*n*, such as a modem and a local area network (LAN) device may be connected to the PCI bus 3000 for enabling access to a public switched telephone network (PSTN) or other networks such as a local area network (LAN) or wireless network. In addition, a PCI device and a universal serial bus (USB) device may also be utilized in compliance with the "PCI Local Bus Specification, Revisions 2.1 and 2.2" and the "Universal Serial Bus Specification, Revision 2.0" published on Apr. 27, 2000 for add-on arrangements with new video, networking, disk memory storage capabilities and communication peripherals such as telephone/fax/modem adapters, answering machines, scanners, personal digital assistants (PDAs) etc.

The memory controller 1620 and the graphics controller (not shown) may be integrated as a single graphics and memory controller hub (GMCH). A GMCH can also be implemented as part of a host chipset along with an I/O controller 1640, for example, in Intel® 810, Intel® 870 and 8XX series chipsets.

Further, a GMCH can be implemented as part of a host chipset, and the I/O controller 1640 can be utilized to provide an interface to a variety of I/O devices and the like, such as: a Peripheral Component Interconnect (PCI) bus (PCI Local Bus Specification Revision 2.2) which may have one or more I/O devices connected to PCI slots, an Industry Standard Architecture (ISA) bus option, and a local area network (LAN) option; a super I/O chip (not shown) for providing an interface with another group of I/O devices such as a mouse, keyboard and other peripheral devices; an audio coder/decoder (Codec) and modem Codec; a plurality of Universal Serial Bus (USB) ports (USB Specification, Revision 1.0, 2.0, ext.); and a plurality of Ultra/66 AT Attachment (ATA) 2 ports (X3T9.2 948D specification; commonly also known as Integrated Drive Electronics (IDE) ports) for receiving one or more magnetic hard disk drives or other I/O devices.

The USB ports and IDE ports may be used to provide an interface to a hard disk drive (HDD), a compact disk drive (CD), a DVD drive, or other type of data storage device. Additional I/O devices and memory devices can also be connected to the I/O controller 1640 of the host chipset 200 to support additional functionality. For example, I/O devices can include, a keyboard controller for controlling operations of an alphanumeric keyboard, a cursor control device such as a mouse, track ball, touch pad, joystick, etc., a mass storage device such as magnetic tapes, hard disk drives (HDD), and floppy disk drives (FDD), and serial and parallel ports to printers and scanners. The memory devices can also be connected to the ICH of the host chipset via a low pin count (LDC) bus. The flash memory can store a set of system basic input/output start up (BIOS) routines at startup of the computer system 1600.

As described above, a semiconductor memory device in accordance with embodiments disclosed herein, include a plurality of resistive-change memory cells, each having a plurality of control transistors formed on different layers and variable resistance devices comprising a resistive-change memory. In addition, the semiconductor memory device has a hierarchical bit line structure that uses a global bit line and local bit lines, thereby increasing the integration density of the semiconductor memory device and the amount of current flowing through each of the resistive-change memory cells. Such memory devices can be used in conjunction with the electronic systems and components describe herein.

While embodiments of the invention have been particularly shown and described with reference to exemplary embodiments thereof, it will be understood by those skilled in the art that various changes in form and details may be made herein without departing from the spirit and scope of the invention as defined by the appended claims.

What is claimed is:

1. A resistive-change memory cell comprising:
   a plurality of control transistors, gates of each of which are connected to a same word line, and the control transistors formed at different layers; and
   a variable resistance device formed of a resistive-change memory,
   wherein one of a first terminal and a second terminal of each of the control transistors is connected to the variable resistance device and the other is connected to a ground voltage,
   wherein the plurality of control transistors are connected to each other in parallel.

2. The resistive-change memory cell of claim 1, wherein the control transistors comprise:
a first control transistor which is a bulk transistor; and
a second control transistor formed on the first control transistor and being a thin layer transistor.

3. The resistive-change memory cell of claim 2, wherein the control transistors further comprise a third control transistor formed on the second control transistor.

4. The resistive-change memory cell of claim 1, wherein each of the control transistors is one of a MOS transistor and a bipolar transistor.

5. The resistive-change memory cell of claim 1, wherein the control transistors form a diode.

6. A resistive-change memory cell comprising:
a first control transistor formed on a first substrate and having a source, gate, and drain;
a second substrate formed on the first control transistor;
a second control transistor formed on the second substrate and having a source, gate, and drain; and
a variable resistance device connected to one of the source and the drain of the second control transistor and formed of a resistive-change memory, wherein:
the source of the first control transistor is electrically connected to the source of the second control transistor,
the drain of the first control transistor is electrically connected to the drain of the second control transistor, and
the gate of the first control transistor is electrically connected to the gate of the second control transistor.

7. The resistive-change memory cell of claim 6, wherein the first and second control transistors have a planar transistor structure.

8. The resistive-change memory cell of claim 6, wherein the first and second control transistors have a fin field effect transistor structure.

9. The resistive-change memory cell of claim 6, wherein the first and second control transistors have a multi-channel field effect transistor structure.

10. The resistive-change memory cell of claim 6, wherein the first control transistor is a bulk transistor and the second control transistor is a thin layer transistor.

11. The resistive-change memory cell of claim 6, wherein the second substrate is formed to be parallel with the first substrate and partially overlap the first substrate, and
a first contact plug which connects the variable resistance device to one of the source and the drain of the first control transistor, and a second contact plug which connects an external power source to one of the source and the drain of the first control transistor are formed of a conductive layer.

12. The resistive-change memory cell of claim 11, wherein the contact plugs are connected to the source and drain of the second control transistor.

13. The resistive-change memory cell of claim 6, wherein the first and second control transistors have different structures which are selected from the structures of a planar transistor, a fin field effect transistor, and a multi-channel field effect transistor.

14. A method of fabricating a resistive-change memory cell, comprising:
forming a first control transistor having a source, gate, and drain on a first substrate;
forming a second substrate on the first control transistor;
forming a second control transistor having a source, gate, and drain on the second substrate; and
connecting a variable resistance device to one of the source and the drain of the second control transistor, the variable resistance device formed of a resistive-change memory, wherein:
the source of the first control transistor is electrically connected to the source of the second control transistor,
the drain of the first control transistor is electrically connected to the drain of the second control transistor, and
the gate of the first control transistor is electrically connected to the gate of the second control transistor.

15. The method of claim 14, wherein the first and second control transistors have a planar transistor structure.

16. The method of claim 14, wherein the first and second control transistors have a fin field effect transistor structure.

17. The method of claim 14, wherein the first and second control transistors have a multi-channel field effect transistor structure.

18. The method of claim 14, wherein the first control transistor is a bulk transistor, and the second control transistor is a thin layer transistor.

19. The method of claim 14, wherein the second substrate is formed to be parallel with the first substrate and partially overlap with the first substrate.

20. The method of claim 19, further comprising forming a first contact plug which connects the variable resistance device to one of the source and the drain of the first control transistor, and a second contact plug which connects an external power source to one of the source and the drain of the first control transistor, wherein the contact plugs are formed of a conductive layer.

21. The method of claim 20, wherein the contact plugs are connected to the source and drain of the second control transistor.

22. The method of claim 14, wherein the first and second control transistors have different structures which are selected from the structures of a planar transistor, a fin field effect transistor, and a multi-channel field effect transistor.

23. The semiconductor memory device comprising:
a global bit line;
a plurality of local bit lines connected to or disconnected from the global bit line via local bit line selection circuits which correspond to the local bit lines, respectively; and
a plurality of resistive-change memory cell groups storing data when connected to the local bit lines, respectively, wherein a resistive-change memory cell of each of the resistive-change memory cell groups comprises:
a plurality of control transistors; and
a variable resistance device formed of a resistive-change material, the variable resistance device coupled to each of the control transistors, wherein the plurality of control transistors are connected to each other in parallel wherein the resistive-change material is a phase change material; wherein the plurality of control transistors comprises:
a first control transistor having first and second channel terminals, wherein the first channel terminal of the first control transistor is coupled to a first terminal of the variable resistance device, and wherein the second terminal of the first control transistor is connected to a reference potential; and
a second control transistor having first and second channel terminals, wherein the first channel terminal of the second control transistor is coupled to the first terminal of the variable resistance device, and wherein the second terminal of the second control transistor is connected to the reference potential.

24. The semiconductor memory device of claim 23, wherein the local bit line selection circuits are transistors that connect the local bit lines to the global bit line or disconnect the local bit lines from the global bit line in response to a local bit line selection signal.

25. The semiconductor memory device of claim 23, wherein gates of the control transistors are connected to a corresponding word line.

26. The semiconductor memory device of claim 23, wherein the number of the plurality of control transistors is two.

27. The semiconductor memory of claim 23, wherein the second channel terminals of the first and second control transistors do not share a common diffusion region in the substrate.

28. The semiconductor memory of claim 23, wherein gates of the first and second control transistors are connected to a corresponding word line.

29. The semiconductor memory of claim 23, wherein the resistive-change memory cell is formed above the substrate.

30. The memory cell of claim 23, wherein the resistive-change memory cell is formed above the first and second control transistors.

31. The memory cell of claim 30, further comprising a sense amplifier connected to the global bit line.

32. The method of claim 23, wherein the first and second control transistors have structures which are selected from the group of structures consisting of: a planar transistor, a fin field effect transistor and a multi-channel field effect transistor.

* * * * *